(12) United States Patent
Machiyama et al.

(10) Patent No.: US 7,286,890 B2
(45) Date of Patent: Oct. 23, 2007

(54) TRANSFER APPARATUS FOR TARGET OBJECT

(75) Inventors: Wataru Machiyama, Kai (JP); Shigeru Ishizawa, Nirasaki (JP); Hiroshi Koizumi, Nirasaki (JP); Tsutomu Hiroki, Nirasaki (JP); Keisuke Kondoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/475,196

(22) Filed: Jun. 27, 2006

(65) Prior Publication Data

US 2006/0291988 A1 Dec. 28, 2006

Related U.S. Application Data

(60) Provisional application No. 60/699,376, filed on Jul. 15, 2005.

(30) Foreign Application Priority Data

Jun. 28, 2005 (JP) .............................. 2005-189026

(51) Int. Cl.
*G06F 19/00* (2006.01)
*G05B 19/18* (2006.01)

(52) U.S. Cl. ........................................ 700/114; 700/63

(58) Field of Classification Search ............ 700/28–31, 700/56, 60–63, 112–114, 117–121, 186–188, 700/192
See application file for complete search history.

(56) References Cited

U.S. PATENT DOCUMENTS

| 4,519,737 A * | 5/1985 | Barry .......................... 414/337 |
| 4,558,266 A * | 12/1985 | Sasaki et al. ................ 318/571 |
| 6,429,139 B1 * | 8/2002 | Ryan et al. .................. 438/716 |
| 6,435,799 B2 * | 8/2002 | Goodwin et al. ....... 414/225.01 |
| 6,435,809 B2 * | 8/2002 | Goodwin et al. ........... 414/805 |
| 2001/0014268 A1 * | 8/2001 | Bryson et al. .............. 414/217 |
| 2003/0202865 A1 * | 10/2003 | Ponnekanti et al. ......... 414/217 |
| 2005/0095111 A1 * | 5/2005 | Kim et al. ............... 414/744.5 |
| 2006/0162660 A1 * | 7/2006 | Shimizu ..................... 118/719 |
| 2006/0182533 A1 * | 8/2006 | Ogi ............................ 414/217 |
| 2006/0222480 A1 * | 10/2006 | Duhamel et al. ........ 414/744.8 |
| 2006/0287761 A1 * | 12/2006 | Ishizawa ..................... 700/218 |
| 2007/0020080 A1 * | 1/2007 | Wirth ..................... 414/744.5 |

FOREIGN PATENT DOCUMENTS

| JP | 5-144692 | 6/1993 |
| JP | 8-46013 | 2/1996 |
| JP | 10-178083 | 6/1998 |
| WO | WO97/34742 | 9/1997 |

* cited by examiner

*Primary Examiner*—M. N. Von Buhr
(74) *Attorney, Agent, or Firm*—Oblon, Spivak, McClelland, Maier & Neustadt, P.C.

(57) ABSTRACT

A processing system includes a transfer chamber, a plurality of chambers connected to the transfer chamber, a transfer apparatus disposed in the transfer chamber, and a control section configured to control the transfer apparatus. The transfer apparatus includes a base and transfer arm configured to perform a slide motion and a swing motion, respectively. The control section includes a storage portion and an operational controller. The storage portion stores pattern model data concerning a plurality of motion patterns each indicative of a composite motion of the slide motion and the swing motion, and track model data concerning time-based motion tracks respectively corresponding to the motion patterns. The operational controller is configured to retrieve necessary data from the pattern model data and the track model data and control the transfer apparatus in accordance therewith.

21 Claims, 21 Drawing Sheets

| Load-lock chamber (From) / Process chamber (To) | M | | N | |
|---|---|---|---|---|
| A | MA$\theta_S$ | 0 | NA$\theta_S$ | 0 |
| | | | | |
| B | MB$\theta_S$ | $Y_S$ | NB$\theta_S$ | $Y_S$ |
| | MB1$\theta_0$ | MB2$\theta_0$ | NB1$\theta_0$ | NB2$\theta_0$ |
| C | MC$\theta_S$ | $Y_S$ | NC$\theta_S$ | $Y_S$ |
| | MC1$\theta_0$ | MC2$\theta_0$ | NC1$\theta_0$ | NC2$\theta_0$ |
| D | $-$MD$\theta_S$ | $Y_S$ | $-$ND$\theta_S$ | $Y_S$ |
| | MD1$\theta_0$ | MD2$\theta_0$ | ND1$\theta_0$ | ND2$\theta_0$ |
| E | $-$ME$\theta_S$ | $Y_S$ | $-$NE$\theta_S$ | $Y_S$ |
| | ME1$\theta_0$ | ME2$\theta_0$ | NE1$\theta_0$ | NE2$\theta_0$ |
| F | $-$MF$\theta_S$ | 0 | $-$NF$\theta_S$ | 0 |
| | | | | |

FIG. 8

| Load-lock chamber (To) / Process chamber (From) | M | | N | |
|---|---|---|---|---|
| A | $-AM_{\theta S}$ | 0 | $-AN_{\theta S}$ | 0 |
|   | / | / | / | / |
| B | $-BM_{\theta S}$ | $-Y_S$ | $-BN_{\theta S}$ | $-Y_S$ |
|   | $BM1_{\theta 0}$ | $BM2_{\theta 0}$ | $BN1_{\theta 0}$ | $BN2_{\theta 0}$ |
| C | $-CM_{\theta S}$ | $-Y_S$ | $-CN_{\theta S}$ | $-Y_S$ |
|   | $CM1_{\theta 0}$ | $CM2_{\theta 0}$ | $CN1_{\theta 0}$ | $CN2_{\theta 0}$ |
| D | $DM_{\theta S}$ | $-Y_S$ | $DN_{\theta S}$ | $-Y_S$ |
|   | $DM1_{\theta 0}$ | $DM2_{\theta 0}$ | $DN1_{\theta 0}$ | $DN2_{\theta 0}$ |
| E | $EM_{\theta S}$ | $-Y_S$ | $EN_{\theta S}$ | $-Y_S$ |
|   | $EM1_{\theta 0}$ | $EM2_{\theta 0}$ | $EN1_{\theta 0}$ | $EN2_{\theta 0}$ |
| F | $FM_{\theta S}$ | 0 | $FN_{\theta S}$ | 0 |
|   | / | / | / | / |

FIG. 9

| Motion pattern | Motion stroke | | Swing start angle (degree) |
|---|---|---|---|
| | $\theta$-axis (degree) | Y-axis (mm) | |
| P1 | $MB\theta_S$ (=$NE\theta_S$) | $Y_S$ | $MB1\theta_0$ (=$NE1\theta_S$) |
| P2 | $MC\theta_S$ (=$ND\theta_S$) | $Y_S$ | $MC1\theta_0$ (=$ND1\theta_S$) |
| P3 | $MD\theta_S$ (=$NC\theta_S$) | $Y_S$ | $MD1\theta_0$ (=$NC1\theta_S$) |
| P4 | $ME\theta_S$ (=$NB\theta_S$) | $Y_S$ | $ME1\theta_0$ (=$NB1\theta_S$) |
| P5 | $BM\theta_S$ (=$EN\theta_S$) | $Y_S$ | $BM1\theta_0$ (=$EN1\theta_S$) |
| P6 | $CM\theta_S$ (=$DN\theta_S$) | $Y_S$ | $CN1\theta_0$ (=$DN1\theta_S$) |
| P7 | $DM\theta_S$ (=$CN\theta_S$) | $Y_S$ | $DM1\theta_0$ (=$CN1\theta_S$) |
| P8 | $EM\theta_S$ (=$BN\theta_S$) | $Y_S$ | $EM1\theta_0$ (=$BN1\theta_S$) |
| ⋮ | ⋮ | ⋮ | ⋮ |
| Pm | Other than motion patterns P1 to P8 | | |

FIG. 10

| Motion pattern (P) / Time (Q) | P1 | | P2 | | ... | Pi | | ... | Pm | |
|---|---|---|---|---|---|---|---|---|---|---|
| | $\theta$-axis | Y-axis | $\theta$-axis | Y-axis | | $\theta$-axis | Y-axis | | $\theta$-axis | Y-axis |
| | $P1_T$ | $P1_T$ | $P2_T$ | $P2_T$ | | $Pi_T$ | $Pi_T$ | | $Pm_T$ | $Pm_T$ |
| Q0 | $P1\theta_{Q0}$ | $P1Y_{Q0}$ | $P2\theta_{Q0}$ | $P2Y_{Q0}$ | | $Pi\theta_{Q0}$ | $PiY_{Q0}$ | | $Pm\theta_{Q0}$ | $PmY_{Q0}$ |
| Q1 | $P1\theta_{Q1}$ | $P1Y_{Q1}$ | $P2\theta_{Q1}$ | $P2Y_{Q1}$ | | $Pi\theta_{Q1}$ | $PiY_{Q1}$ | | $Pm\theta_{Q1}$ | $PmY_{Q1}$ |
| Q2 | $P1\theta_{Q2}$ | $P1Y_{Q2}$ | $P2\theta_{Q2}$ | $P2Y_{Q2}$ | | $Pi\theta_{Q2}$ | $PiY_{Q2}$ | | $Pm\theta_{Q2}$ | $PmY_{Q2}$ |
| Q3 | $P1\theta_{Q3}$ | $P1Y_{Q3}$ | $P2\theta_{Q3}$ | $P2Y_{Q3}$ | | $Pi\theta_{Q3}$ | $PiY_{Q3}$ | | $Pm\theta_{Q3}$ | $PmY_{Q3}$ |
| Q4 | $P1\theta_{Q4}$ | $P1Y_{Q4}$ | $P2\theta_{Q4}$ | $P2Y_{Q4}$ | | $Pi\theta_{Q4}$ | $PiY_{Q4}$ | | $Pm\theta_{Q4}$ | $PmY_{Q4}$ |
| Q5 | $P1\theta_{Q5}$ | $P1Y_{Q5}$ | $P2\theta_{Q5}$ | $P2Y_{Q5}$ | ... | $Pi\theta_{Q5}$ | $PiY_{Q5}$ | ... | $Pm\theta_{Q5}$ | $PmY_{Q5}$ |
| Q6 | $P1\theta_{Q6}$ | $P1Y_{Q6}$ | $P2\theta_{Q6}$ | $P2Y_{Q6}$ | | $Pi\theta_{Q6}$ | $PiY_{Q6}$ | | $Pm\theta_{Q6}$ | $PmY_{Q6}$ |
| Q7 | $P1\theta_{Q7}$ | $P1Y_{Q7}$ | $P2\theta_{Q7}$ | $P2Y_{Q7}$ | | $Pi\theta_{Q7}$ | $PiY_{Q7}$ | | $Pm\theta_{Q7}$ | $PmY_{Q7}$ |
| ⋮ | ⋮ | ⋮ | ⋮ | ⋮ | | ⋮ | ⋮ | | ⋮ | ⋮ |
| Qj | $P1\theta_{Qj}$ | $P1Y_{Qj}$ | $P2\theta_{Qj}$ | $P2Y_{Qj}$ | | $Pi\theta_{Qj}$ | $PiY_{Qj}$ | | $Pm\theta_{Qj}$ | $PmY_{Qj}$ |
| ⋮ | ⋮ | ⋮ | ⋮ | ⋮ | | ⋮ | ⋮ | | ⋮ | ⋮ |
| Qn | $P1\theta_{Qn}$ | $P1Y_{Qn}$ | $P2\theta_{Qn}$ | $P2Y_{Qn}$ | | $Pi\theta_{Qn}$ | $PiY_{Qn}$ | | $Pm\theta_{Qn}$ | $PmY_{Qn}$ |

294

F I G. 11

| Motion pattern (P) / Time (Q) | Pm | |
|---|---|---|
| | θ-axis | Y-axis |
| | 2.32 sec | 2.32 sec |
| Q0 | 0.000000 | 0.000000 |
| Q1 | 0.000412 | 0.000244 |
| Q2 | 0.003292 | 0.001951 |
| Q3 | 0.011111 | 0.006584 |
| Q4 | 0.026150 | 0.015607 |
| Q5 | 0.049164 | 0.030482 |
| Q6 | 0.080157 | 0.052301 |
| Q7 | 0.119066 | 0.081213 |
| Q8 | 0.164588 | 0.117217 |
| ⋮ | ⋮ | ⋮ |
| Qn | 1.000000 | 1.000000 |

| Motion pattern (P) | Process mode | Number of wafers | Motion stroke θ-axis (degree) | Motion stroke Y-axis (mm) | Swing start angle (degree) |
|---|---|---|---|---|---|
| P1 | Normal | 1 | 0 < θ ≤ 26 | 870 | 0 < θ ≤ 360 |
| P2 | Normal | 1 | 71 < θ ≤ 75 | 870 | 16 < θ ≤ 36 |
| P3 | Normal | 1 | 71 < θ ≤ 75 | 870 | 85 < θ ≤ 105 |
| P4 | Normal | 1 | 71 < θ ≤ 75 | 870 | 144 < θ ≤ 164 |
| P5 | Normal | 1 | 71 < θ ≤ 75 | 870 | 217 < θ ≤ 237 |
| P6 | Normal | 1 | 105 < θ ≤ 109 | 870 | 16 < θ ≤ 36 |
| P7 | Normal | 1 | 105 < θ ≤ 109 | 870 | 80 < θ ≤ 100 |
| P8 | Normal | 1 | 105 < θ ≤ 109 | 870 | 123 < θ ≤ 143 |
| P9 | Normal | 1 | 105 < θ ≤ 109 | 870 | 144 < θ ≤ 164 |
| P10 | Normal | 1 | 105 < θ ≤ 109 | 870 | 187 < θ ≤ 207 |
| P11 | Normal | 1 | 105 < θ ≤ 109 | 870 | 251 < θ ≤ 271 |
| P12 | Normal | 1 | 131 < θ ≤ 135 | 870 | 82 < θ ≤ 102 |
| P13 | Normal | 1 | 131 < θ ≤ 135 | 870 | 147 < θ ≤ 167 |
| P14 | Normal | 1 | 131 < θ ≤ 135 | 870 | 210 < θ ≤ 230 |
| P15 | Normal | 1 | 165 < θ ≤ 169 | 870 | 76 < θ ≤ 96 |
| P16 | Normal | 1 | 165 < θ ≤ 169 | 870 | 123 < θ ≤ 143 |
| P17 | Normal | 1 | 165 < θ ≤ 169 | 870 | 140 < θ ≤ 160 |
| P18 | Normal | 1 | 165 < θ ≤ 169 | 870 | 194 < θ ≤ 216 |
| P19 | Normal | 1 | 165 < θ ≤ 169 | 870 | 250 < θ ≤ 270 |
| P20 | Normal | 1 | Other than motion patterns P1 to P19 | | |
| P21 | Normal | 2 | - | - | - |
| P22 | Normal | 0 | - | - | - |
| P23 | Initialization | - | - | - | - |
| P24 | Maintenance | - | - | - | - |

FIG. 17

| Motion pattern (P) | P6 | | P9 | |
|---|---|---|---|---|
| Time (Q) | θ-axis | Y-axis | θ-axis | Y-axis |
| | 1.64 sec | 1.64 sec | 1.8 sec | 1.8 sec |
| Q0 | 0.000000 | 0.000000 | 0.000000 | 0.000000 |
| Q1 | 0.000103 | 0.000505 | 0.000176 | 0.000597 |
| Q2 | 0.000827 | 0.004040 | 0.001406 | 0.004778 |
| Q3 | 0.002792 | 0.013599 | 0.004745 | 0.015969 |
| Q4 | 0.006618 | 0.030653 | 0.011248 | 0.035206 |
| Q5 | 0.012925 | 0.054674 | 0.021969 | 0.061642 |
| Q6 | 0.022334 | 0.084995 | 0.037962 | 0.094383 |
| Q7 | 0.035466 | 0.120950 | 0.060282 | 0.132532 |
| Q8 | 0.052940 | 0.161870 | 0.089984 | 0.175194 |
| ⋮ | ⋮ | ⋮ | ⋮ | ⋮ |
| Qn | 1.000000 | 1.000000 | 1.000000 | 1.000000 |

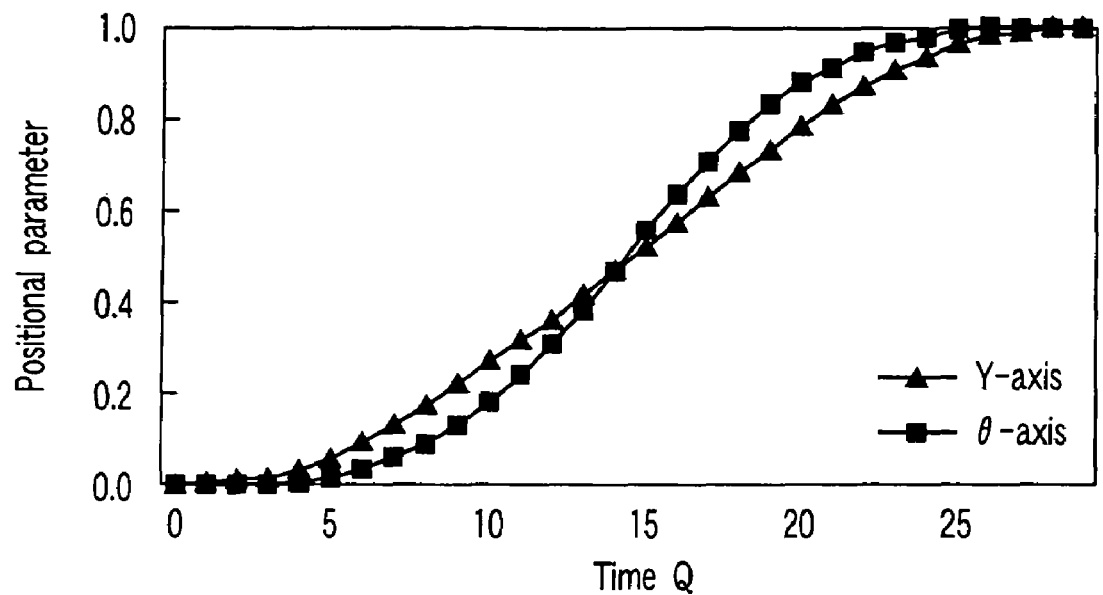
F I G. 20
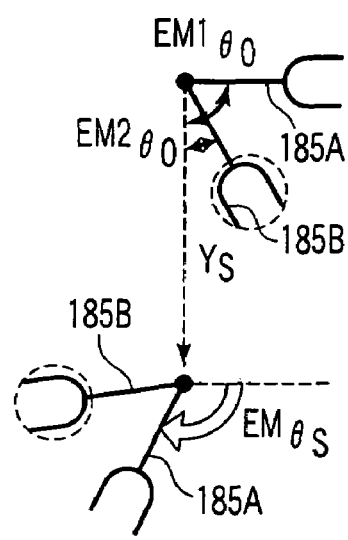
F I G. 21

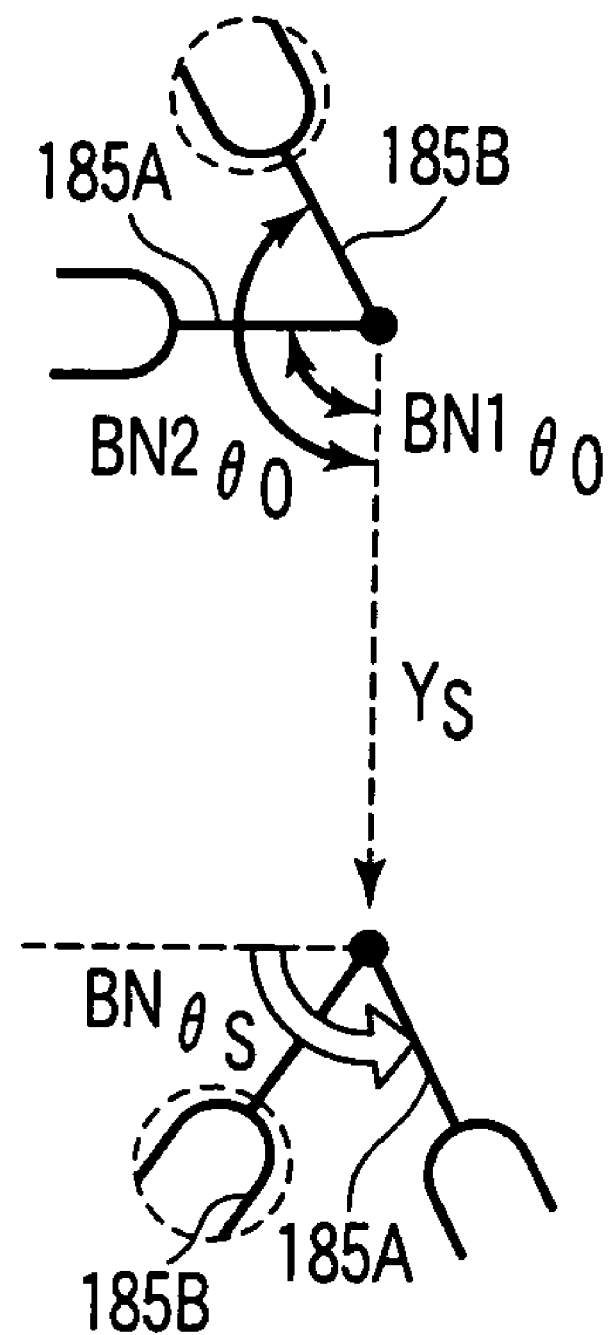
F I G. 22

TRANSFER APPARATUS FOR TARGET OBJECT

CROSS-REFERENCE TO RELATED APPLICATIONS

This application claims the benefit of U.S. Provisional Application No. 60/699,376, filed Jul. 15, 2006.

This application is based upon and claims the benefit of priority from prior Japanese Patent Application No. 2005-189026, filed Jun. 28, 2005, the entire contents of which are incorporated herein by reference.

BACKGROUND OF THE INVENTION

1. Field of the Invention

The present invention relates to a transfer apparatus for transferring a target object, such as a semiconductor wafer, in a processing system, such as a semiconductor processing system; a processing system employing the transfer apparatus; and a method for controlling the transfer apparatus. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an LCD (Liquid Crystal Display) or FPD (Flat Panel Display), by forming semiconductor layers, insulating layers, and conductive layers in predetermined patterns on the target object.

2. Description of the Related Art

In the process of manufacturing semiconductor devices, a semiconductor wafer is subjected to various semiconductor processes, such as film formation (e.g., CVD (Chemical Vapor Deposition)), etching, sputtering, oxidation, diffusion, and so forth. In these processes, owing to the demands of increased miniaturization and integration of semiconductor devices, the throughput and yield involving these processes need to be increased. In light of this, there is a semiconductor processing system of the so-called cluster tool type (i.e., multi-chamber type), which has a plurality of process chambers for performing the same process, or a plurality of process chambers for performing different processes, connected to a common transfer chamber. With this system, various steps can be performed in series, without exposing a wafer to air.

Processing systems of the cluster tool type include a common transfer chamber formed of a polygonal (e.g., hexagonal) casing, and a plurality of process chambers and load-lock chambers respectively connected to the side surfaces of the common transfer chamber. In such processing systems, the common transfer chamber is provided with a transfer apparatus disposed near the center thereof and having an articulated transfer arm, which is extendable/retractable and swingable. The transfer arm can face each of the chambers including the process chambers by rotation of the transfer apparatus. Accordingly, a wafer can be transferred to and from any one of the chambers including the process chambers (i.e., they are accessible) by rotation of the transfer apparatus (e.g., Jpn. Pat. Appln. KOKAI Publication No. 8-46013 (Patent Document 1).

In this transfer apparatus, when the transfer arm is swung along with a wafer supported thereon, it is necessary to maintain the position of the wafer, although a swing motion is preferably performed at a high speed. For this reason, for example, an acceleration to be applied to a wafer on the transfer arm is considered, and the transfer arm is controlled during the swing to set the acceleration to be less than a permissible limit (e.g., a permissible maximum acceleration or permissible maximum acceleration change rate).

Further, in recent years, owing to the demands of increased miniaturization and integration of semiconductor devices, the number of steps has been increased in the process of manufacturing semiconductor devices. Accordingly, the number of process chambers connected to a common transfer chamber is preferably increased to improve the process efficiency. In this respect, there is known a processing system of such a type that includes two or more processing sections each having a common transfer chamber with a transfer apparatus disposed therein, and a plurality of process chambers respectively connected to the side surfaces of the common transfer chamber. In this processing system, a wafer can be transferred to and from any one of the process chambers of the processing sections (i.e., they are accessible) by rotation of the respective transfer apparatuses.

BRIEF SUMMARY OF THE INVENTION

An object of the present invention is to provide a transfer apparatus that can transfer a target object stably at a high speed; a processing system employing the transfer apparatus; and a method for controlling the transfer apparatus.

According to a first aspect of the present invention, there is provided a processing system comprising:

a polygonal transfer chamber elongated in one direction;

a plurality of chambers disposed around and connected to the transfer chamber, the plurality of chambers including a process chamber configured to perform a process on a target object;

a transfer apparatus disposed in the transfer chamber and configured to transfer the target object to and from the plurality of chambers, the transfer apparatus including a base configured to perform a slide motion in a longitudinal direction of the transfer chamber, and an extendable/retractable transfer arm supported on the base and configured to perform a swing motion; and a control section configured to control the transfer apparatus, wherein the control section comprises a storage portion that stores pattern model data concerning a plurality of motion patterns each indicative of a composite motion of the slide motion and the swing motion necessary for transferring the target object between two of the plurality of chambers, and track model data concerning time-based motion tracks of the slide motion and the swing motion, respectively corresponding to the motion patterns, each of the time-based motion tracks being preset to prevent a composite acceleration applied to the target object on the transfer arm by the composite motion from exceeding a permissible limit, and an operational controller configured to retrieve a motion pattern and a time-based motion track from the pattern model data and the track model data to satisfy specific transfer of the target object between two of the plurality of chambers, and control an operation of the base and the transfer arm in accordance with the retrieved motion pattern and time-based motion track.

According to a second aspect of the present invention, there is provided a transfer apparatus for transferring a target object, the apparatus comprising:

a base configured to perform a slide motion;

an extendable/retractable transfer arm supported on the base and configured to perform a swing motion; and a control section configured to control the transfer apparatus, wherein the control section comprises a storage portion that stores pattern model data concerning a plurality of motion patterns each indicative of a composite motion of the slide motion and the swing motion necessary for transferring the target object, and track model data concerning time-based motion tracks of the slide motion and the swing motion, respectively corresponding to the motion patterns, each of the time-based motion tracks being preset to prevent a composite acceleration applied to the target object on the transfer arm by the composite motion from exceeding a permissible limit, and an operational controller configured to retrieve a motion pattern and a time-based motion track from the pattern model data and the track model data to satisfy specific transfer of the target object, and control an operation of the base and the transfer arm in accordance with the retrieved motion pattern and time-based motion track.

According to a third aspect of the present invention, there is provided a method for controlling a transfer apparatus for transferring a target object, the apparatus comprising a base configured to perform a slide motion, and an extendable/retractable transfer arm supported on the base and configured to perform a swing motion, the method comprising:

storing, in a storage portion, pattern model data concerning a plurality of motion patterns each indicative of a composite motion of the slide motion and the swing motion necessary for transferring the target object, and track model data concerning time-based motion tracks of the slide motion and the swing motion, respectively corresponding to the motion patterns, each of the time-based motion tracks being preset to prevent a composite acceleration applied to the target object on the transfer arm by the composite motion from exceeding a permissible limit;

retrieving a motion pattern and a time-based motion track from the pattern model data and the track model data to satisfy specific transfer of the target object; and controlling an operation of the base and the transfer arm in accordance with the retrieved motion pattern and time-based motion track.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 8 is a view showing a list of some of the motion patterns shown in FIGS. 5 to 7, in which a first transfer arm is moved from a load-lock chamber to a process chamber;

FIG. 9 is a view showing a list of some of the motion patterns shown in FIGS. 5 to 7, in which a first transfer arm is moved from a process chamber to a load-lock chamber;

FIG. 10 is a view showing an example of pattern model data for the transfer apparatus shown in FIG. 2A;

FIG. 11 is a view showing an example of track model data for the transfer apparatus shown in FIG. 2A;

FIG. 17 is a view showing pattern model data with categorized motion patterns, according to an experiment in relation to control of the transfer apparatus shown in FIG. 2A;

FIG. 20 is a graph showing a time-based motion track expressed by the positional parameters of the ninth motion pattern P9 shown in FIG. 18;

FIG. 21 is a view schematically showing a motion of the transfer apparatus shown in FIG. 2A, corresponding to the sixth motion pattern P6 shown in FIG. 18;

FIG. 22 is a view schematically showing a motion of the transfer apparatus shown in FIG. 2A, corresponding to the ninth motion pattern P9 shown in FIG. 18;

DETAILED DESCRIPTION OF THE INVENTION

Figure 1:
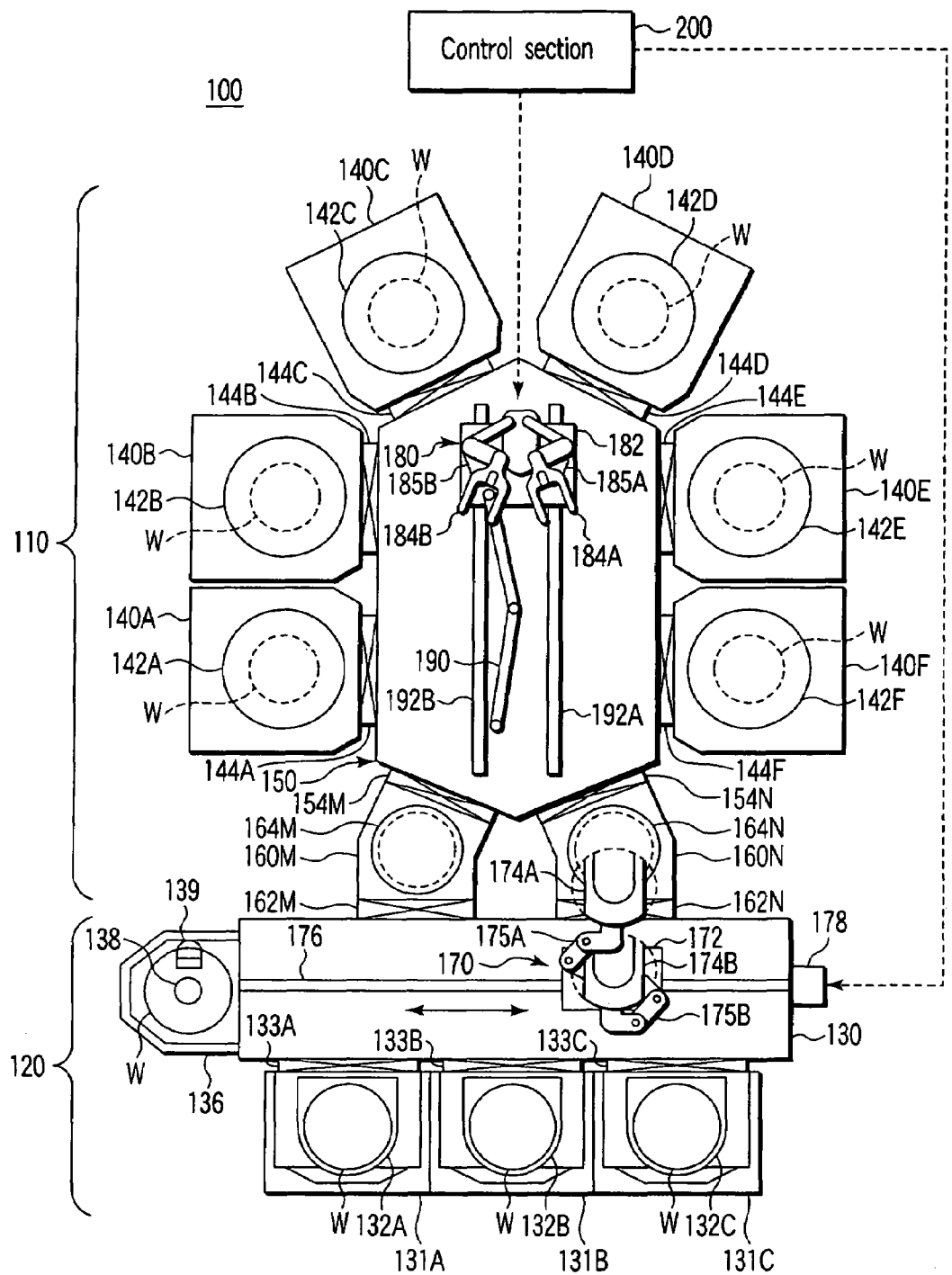
FIG. 1 is a plan view showing a semiconductor processing system according to an embodiment of the present invention.

In the process of developing the present invention, the inventors studied problems and countermeasures for the same with regard to transfer mechanisms used in conventional semiconductor processing systems of the cluster tool type. As a result, the inventors have arrived at the findings given below.

In processing systems of the type that includes two or more processing sections each having a common transfer chamber and process chambers, transfer apparatuses are respectively disposed in the common transfer chambers. Accordingly, it is necessary for the transfer apparatuses to deliver wafers to and from each other. For example, a transfer table is disposed between the common transfer chambers, and a wafer is placed thereon by one of the transfer apparatuses and is picked up by the other of the transfer apparatuses. In this case, the number of wafer handling operations is increased, so the entire throughput of a wafer process is lower and the transfer accuracy is also lower.

Alternatively, a processing system may be assumed such that a polygonal common transfer chamber is elongated in one direction, and only one transfer apparatus is disposed therein to access all the process chambers connected thereto. In this case, the transfer apparatus needs not only to have a swingable transfer arm, but also to be movable in the longitudinal direction of the common transfer chamber. However, where a transfer arm simultaneously performs a swing motion and a slide motion, i.e., a composite motion, a wafer on the transfer arm receives a composite acceleration formed of an acceleration due to the swing motion and an acceleration due to the slide motion.

In this case, even if each of the accelerations respectively due to the swing and slide motions is set to be less than a permissible limit (e.g., permissible maximum acceleration or permissible maximum acceleration change rate), the composite acceleration created by the two motions may exceed the permissible limit. Reversely, the composite acceleration created by the two motions may be far less than the permissible limit, and thereby bring about a very large value of the acceleration margin. In other words, in this latter case, although the transfer time period can be further shortened, this chance is wasted.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

(Processing System)

FIG. 1 is a plan view showing a semiconductor processing system according to an embodiment of the present invention. This processing system 100 includes a processing section 110 for performing various semiconductor processes, such as film formation and etching, on target objects, such as semiconductor wafers (which may be simply referred to as wafers, hereinafter), and a loader section 120 for transferring wafers W to and from the processing section 110.

As shown in FIG. 1, the loader section 120 includes a loader transfer chamber 130 for transferring wafers between wafer-storing containers, such as wafer cassettes 132 (132A to 132C), and the processing section 110. The loader transfer chamber 130 is formed of a laterally long casing. On one long side of this loader transfer chamber 130, a plurality of cassette tables 131 (131A to 131C) are disposed. Each of the cassette tables 131A to 131C is structured to place one of the wafer cassettes 132A to 132C thereon.

Each of the wafer cassettes 132 (132A to 132C) can accommodate a plurality of, e.g., 25, wafers at most with regular intervals therebetween in the vertical direction. The inside of each wafer cassette 132 is structured to be airtight and filled with, e.g., an $N_2$ gas atmosphere. The loader transfer chamber 130 is connected to the wafer cassettes 132 through gate valves 133 (133A to 133C). The number of the cassette tables 131 and the number of wafer cassettes 132 are not limited to those shown in FIG. 1.

An orientor 136 is disposed at an end of the loader transfer chamber 130 and used as an alignment unit for performing alignment of a wafer W. The orientor 136 includes a rotary table 138, which is rotated by a drive motor, along with the wafer W placed thereon. An optical sensor 139 is disposed around the rotary table 138, to detect the peripheral edge of the wafer W. The orientor 136 detects, e.g., the orientation flat or notch of the wafer W to perform alignment thereof.

The loader transfer chamber 130 is provided with a transfer apparatus 170 disposed therein for transferring wafers W in the longitudinal direction of the chamber 130. The transfer apparatus 170 is used to transfer wafers W among the wafer cassettes 132A to 132C, load-lock chambers 160M and 160N, and orientor 136. The transfer apparatus 170 has first and second transfer arms 175A and 175B of the articulated arm type disposed at two height levels. The transfer arms 175A and 175B are extendable/retractable in a radial direction from the center, and can be independently controlled to perform a rectilinear motion. The transfer arms 175A and 175B have rotational shafts coaxially and rotatably connected to the base 172, and can be rotated together relative to the base 172.

The base 172 of the transfer apparatus 170 is slidably supported on a guide rail 176 extending in the longitudinal direction of the loader transfer chamber 130 at the center. The base 172 and guide rail 176 are respectively provided with the movable member and stationary member of a linear motor. A drive mechanism 178 for the linear motor is disposed at one end of the guide rail 176, and is connected to a control section 200. The drive mechanism 178 is controlled by a control signal from the control section 200 to move the base 172 of the transfer apparatus 170 along the guide rail 176.

In place of the linear motor, a ball screw mechanism may be used to slide the transfer apparatus 170, as in a transfer apparatus 180 disposed in the processing section described later. In this case, the ball screw is disposed beside the guide rail 176 to engage with base 172 of the transfer apparatus 170. The ball screw is driven by a motor to move the base 172 along the guide rail 176.

The first and second transfer arms 175A and 175B of the transfer apparatus 170 respectively have picks 174A and 174B at their distal ends. Accordingly, the transfer apparatus 170 can handle two wafers at one time. For example, when wafers are transferred to and from the wafer cassettes 132, orientor 136, and load-lock chambers 160M and 160N, wafer exchange can be swiftly performed. The transfer apparatus 170 may be designed to have only one transfer arm (a single transfer arm mechanism).

The transfer apparatus 170 includes respective motors (not shown) to cause the transfer arms to swing and extend/retract. Further, the transfer apparatus 170 may include a motor (not shown) to move the transfer arms up and down. These motors are connected to the control section 200, so that the transfer apparatus 170 is controlled by control signals from the control section 200.

On the other hand, the processing section 110 is structured to be of, e.g., the cluster tool type. As shown in FIG. 1, the processing section 110 has a common transfer chamber 150 having a polygonal shape (e.g., rectangular shape, pentagonal shape, hexagonal shape, or octagonal shape) elongated in one direction. A plurality of process chambers 140 (140A to 140F) and load-lock chambers 160M and 160N are disposed around the common transfer chamber 150 and connected thereto. The process chambers 140 are arranged to respectively perform predetermined processes, such as film formation (e.g., plasma CVD) and etching (e.g., plasma etching).

Specifically, the common transfer chamber 150 has an elongated hexagonal shape. Two of the short sides of the elongated hexagonal common transfer chamber 150 near the distal end are respectively connected to the process chambers 140C and 140D. Two of the short sides near the proximal end are respectively connected to the load-lock chambers 160M and 160N. One of the long sides of the common transfer chamber 150 is connected to two process chambers 140A and 140B disposed side by side. The other of the long sides is connected to two process chambers 140E and 140F disposed side by side.

The process chambers 140A to 140F are arranged to perform the same process or different processes on wafers W. The process chambers 140 (140A to 140F) are respectively provided with worktables 142 (142A to 142E) disposed therein to place a wafer W thereon. The number of the process chambers 140 is not limited to that shown in FIG. 1. In each of the process chambers 140A to 140F, a wafer W is processed in accordance with wafer process data, such as a process recipe showing process steps, stored in a storage portion 290 of the control section 200 in advance.

The common transfer chamber 150 is used to transfer wafers W among the process chambers 140A to 140F and first and second load-lock chambers 160M and 160N. The process chambers 140 (140A to 140F) are connected to the common transfer chamber 150 respectively through gate valves 144 (144A to 144E). The first and second load-lock chambers 160M and 160N are connected to the common transfer chamber 150 respectively through gate valves (vacuum side gate valves) 154M and 154N. The first and second load-lock chambers 160M and 160N are also connected to the loader transfer chamber 130 respectively through gate valves (atmospheric side gate valves) 162M and 162N.

Each of the first and second load-lock chambers 160M and 160N is arranged to temporarily hold a wafer W and adjust the pressure therein before delivery of the wafer W. The first and second load-lock chambers 160M and 160N are respectively provided with transfer tables 164M and 164N disposed therein to place a wafer W thereon.

Each of the first and second load-lock chambers 160M and 160N is arranged to be vacuum-exhausted to adjust the pressures therein. Specifically, each of the first and second load-lock chambers 160M and 160N is connected to an exhaust system including a vacuum pump, such as a dry pump, through an exhaust line provided with an exhaust valve (exhaust control valve). Further, each of the first and second load-lock chambers 160M and 160N is connected to a gas supply system, such as a gas supply source, through a gas supply line provided with a purge valve (purge gas control valve). The purge valve and exhaust valve are controlled to repeat purge gas supply and vacuum exhaust, so as to perform a purge operation.

Each of the common transfer chamber 150 and process chambers 140A to 140F is also arranged to be vacuum-exhausted to adjust the pressures therein. Specifically, the common transfer chamber 150 is similarly connected to a gas supply system for supplying a purge gas and an exhaust system for performing vacuum exhaust. Each of the process chambers 140A to 140F is similarly connected to a gas supply system for supplying a process gas as well as a purge gas and an exhaust system for performing vacuum exhaust.

As described above, the portion between the common transfer chamber 150 and each of the process chambers 140A to 140F, and the portion between the common transfer chamber 150 and each of the load-lock chambers 160M and 160N can be opened and closed airtightly. The portion between each of the first and second load-lock chambers 160M and 160N and loader transfer chamber 130 can also be opened and closed airtightly.

The common transfer chamber 150 is provided with a transfer apparatus 180 disposed therein for transferring wafers W among the load-lock chambers 160M and 160N and process chambers 140A to 140F. The transfer apparatus 180 has first and second transfer arms 185A and 185B of the articulated arm type, which are disposed right and left and are extendable/retractable to perform a rectilinear motion, (a double transfer arm mechanism). The first and second transfer arms 185A and 185B are connected to a base 182 to be swingable by a swing mechanism. The base 182 is slidable by a slide mechanism in the longitudinal direction of the common transfer chamber 150. The structure of the transfer apparatus 180 will be described later in detail.

Portions of the processing system 100, such as the transfer apparatus 170 and transfer apparatus 180, are respectively controlled by the control section 200. Further, for example, the gate valves 133, 144, 154, and 162, and orientor 136 are also respectively controlled by the control section 200.

(Transfer Apparatus)

Figure 2A:
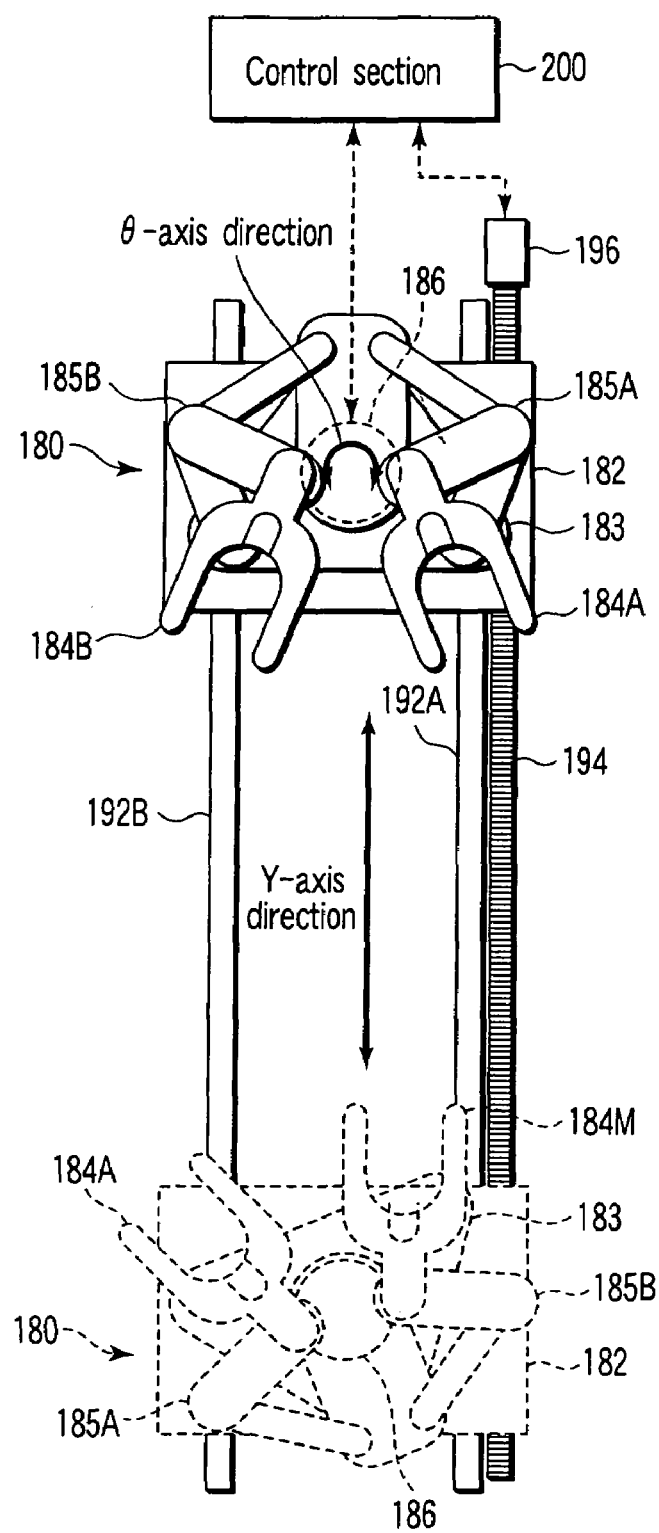
FIG. 2A is a plan view showing a transfer apparatus disposed in the processing section of the processing system shown in FIG. 1.

FIG. 2A is a plan view showing the transfer apparatus 180. As shown in FIG. 2A, the transfer apparatus 180 includes the base 182, to which the first and second transfer arms 185A and 185B are connected. The base 182 is slidably supported on guide rails 192A and 192B in the direction of a Y-axis or slide motion axis (in the longitudinal direction of the common transfer chamber 150). For example, a ball screw 194 engages with the base 182 of the transfer apparatus 180 and is driven by a Y-axis motor (slide motion motor) 196. The Y-axis motor 196 is driven to control the slide motion of the transfer arms of the transfer apparatus 180.

For example, as shown in FIG. 2A, in the transfer apparatus 180, the first and second transfer arms 185A and 185B are connected to the base 182 through a rotary plate 183, which is swingable in the direction of a θ-axis or swing motion axis. The θ-axis motor 186 is driven to control the swing motion of the transfer arms of the transfer apparatus 180.

The first and second transfer arms 185A and 185B of the transfer apparatus 180 respectively have picks 184A and 184B at their distal ends. Accordingly, the transfer apparatus 180 can handle two wafers at one time. For example, when wafers are transferred to and from the load-lock chambers 160M and 160N and process chambers 140A to 140F, wafer exchange can be swiftly performed. The transfer apparatus 180 may be designed to have only one transfer arm (a single transfer arm mechanism).

The transfer apparatus 180 includes a motor (not shown) to cause the transfer arms to extend/retract. For example, this motor is disposed below the θ-axis motor (swing motion motor) 186 and is controlled independently of the motor 186. Further, the transfer apparatus 180 may include a motor (not shown) to move the transfer arms up and down. These motors including motors 186 and 196 are connected to the control section 200, so that the transfer apparatus 180 is controlled by control signals from the control section 200. The operational control of the transfer apparatus 180 will be described later in detail.

For example, as shown in FIG. 1, a flexible tube 190 is connected to the base 182 of the transfer apparatus 180 for interconnection wires to extend therethrough to, e.g., the θ-axis motor 186. The flexible tube 190 extends through a hole formed in the bottom of the common transfer chamber 150, and is structured to be airtight while its inside communicates with the atmosphere. Accordingly, when a vacuum is set inside the common transfer chamber 150, atmospheric pressure is maintained inside the flexible tube 190 to prevent the wires from being damaged.

In the transfer apparatus 180 described above, the base 182 is driven to slide along the guide rails 192A and 192B. The transfer apparatus can thus transfer wafers to and from (or can access) any one of the load-lock chambers 160M and 160N and process chambers 140A to 140F by the transfer arms being extended/retracted.

For example, a first reference position (a position indicated with broken lines in FIG. 2A) for locating the transfer apparatus 180 is preset near the proximal end of the common transfer chamber 150 in the Y-axis direction. At this position, the transfer apparatus 180 is rotated to direct one of the transfer arms (first and second transfer arms 185A and 185B) to a destination of the chambers connected near the proximal end of common transfer chamber 150 (load-lock chambers 160M and 160N and process chambers 140A and 140F). Then, the transfer arm is extended/retracted to transfer a wafer to and from the destination chamber by the corresponding one of the picks 184A and 184B.

On the other hand, a second reference position (a position indicated with solid lines in FIG. 2A) for locating the transfer apparatus 180 is preset near the distal end of the common transfer chamber 150 in the Y-axis direction. At this position, the transfer apparatus 180 is rotated to direct one of the transfer arms (first and second transfer arms 185A and 185B) to a destination of the chambers connected near the distal end of common transfer chamber 150 (process chambers 140B to 140E). Then, the transfer arm is extended/retracted to transfer a wafer to and from the destination chamber by the corresponding one of the picks 184A and 184B.

When a wafer is transferred between one of the chambers near the proximal end (load-lock chambers 160M and 160N and process chambers 140A and 140F) and one of the chambers near the distal end (process chambers 140B to 140E), the transfer apparatus 180 is caused to slide and swing. With this operation, one of the transfer arms (first and second transfer arms 185A and 185B) is directed to a destination of the chambers. Then, the transfer arm is extended/retracted to transfer a wafer to and from the destination chamber by the corresponding one of the picks 184A and 184B.

In this respect, in place of one slidable transfer apparatus 180 disposed in the common transfer chamber 150, a plurality of transfer apparatuses may be disposed and operated to deliver wafers to and from each other, as in the prior art. However, in this case, the number of wafer handling operations is increased, so the entire throughput of a wafer process is lowered by that much and the transfer accuracy is also lowered. On the other hand, according to this embodiment, there is no need to deliver wafers to and from each other between transfer apparatuses. Consequently, the number of wafer handling operations is decreased, so the entire throughput of a wafer process is higher by that much and the transfer accuracy is also improved.

Further, in the processing system 100 according to this embodiment, the common transfer chamber 150 is elongated in one direction, and process chambers are added along the long sides of the chamber. The number of process chambers connected to the sides of the common transfer chamber 150 is thus increased.

Figure 2B:
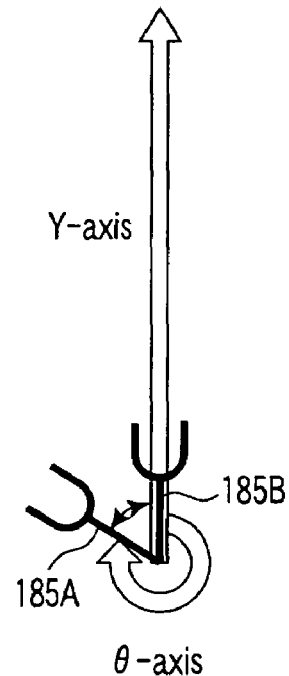
FIG. 2B is a view showing coordinate axes of a Y-axis and a θ-axis in the transfer apparatus shown in FIG. 2A.

As described above, the transfer apparatus 180 is controlled by slide motion for position in the Y-axis direction and by swing motion for orientation in the θ-axis direction. Accordingly, for example, the coordinate axes of the Y-axis and θ-axis are preset, as shown in FIG. 2B, and used for controlling the slide motion and swing motion. In FIG. 2B, the first and second transfer arms 185A and 185B are shown with lines extending in the rectilinear direction thereof, so that the angle of the θ-axis can be easily seen.

As shown in FIG. 2B, for the Y-axis, the reference position (the position indicated with broken lines in FIG. 2A) near the proximal end of the common transfer chamber 150 is preset as "0", and the direction therefrom toward the reference position (the position indicated with solid lines in FIG. 2A) near the distal end is preset to be positive. The motion stroke between the reference position near the proximal end and the reference position near the distal end is defined as $Y_S$. For the θ-axis, the angle of the Y-axis is preset as "0", and the clockwise rotation therefrom is preset to be positive. The swing start angle of each of the first and second transfer arms 185A and 185B is defined by an angle formed between the Y-axis and transfer arm in its swing direction. For example, where the transfer arm is swung clockwise, the swing start angle is defined by an angle in the clockwise direction. Where the transfer arm is swung counterclockwise, the swing start angle is defined by an angle in the counterclockwise direction.

(Control Section)

Figure 3:
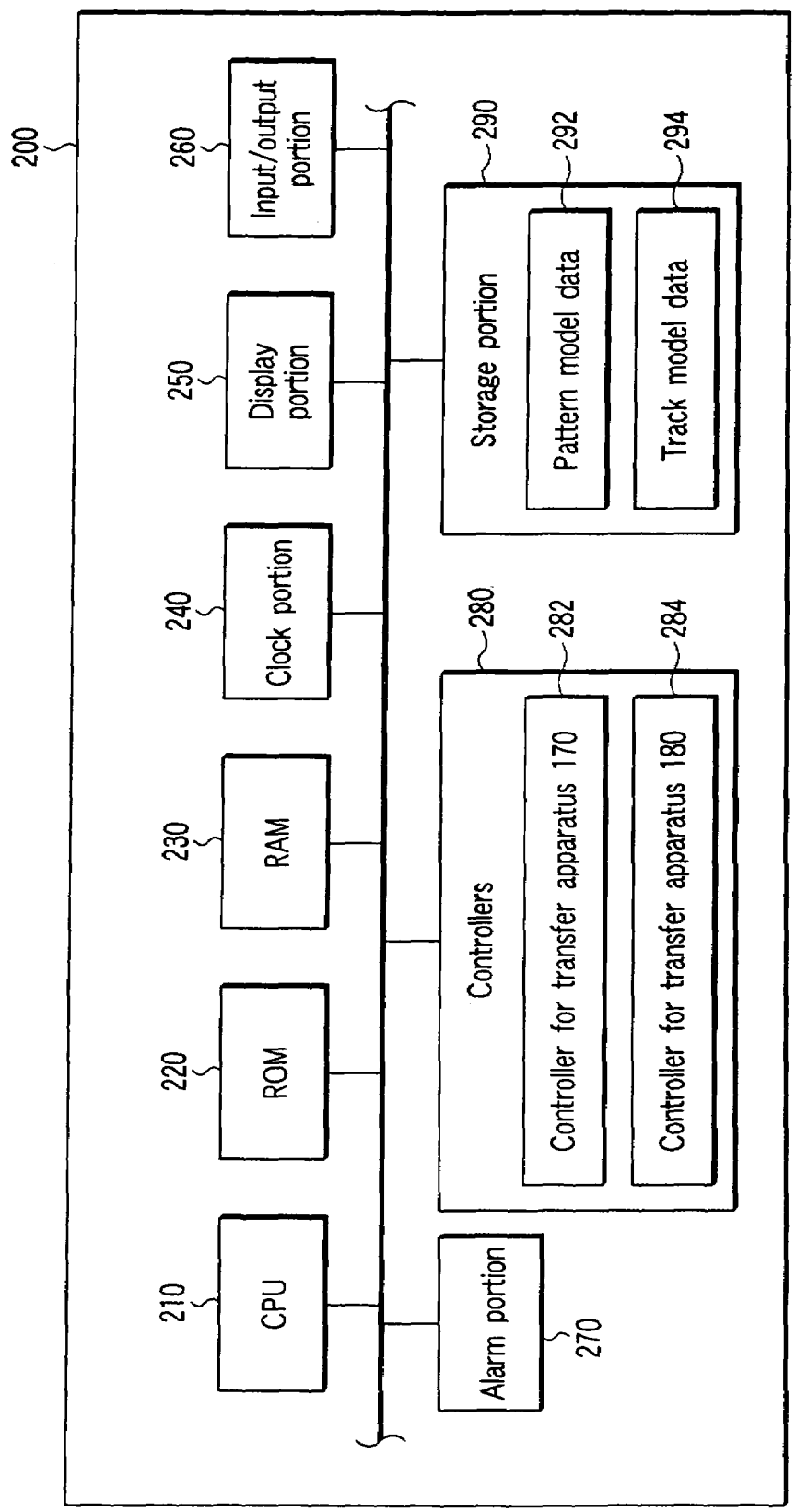
FIG. 3 is a block diagram showing the control section of the processing system shown in FIG. 1.

FIG. 3 is a block diagram showing the control section 200. As shown in FIG. 3, the control section 200 includes functional portions, as follows. Specifically, a CPU (Central Processing Unit) 210 is the main body of the control section and controls respective portions. A ROM (Read Only Memory) 220 stores program data (e.g., program data for controlling operations of the transfer apparatuses 170 and 180, program data for performing wafer processes with reference to process recipes, and so forth). A RAM (Random Access Memory) 230 is used as a memory area for processing data of various kinds by the CPU 210. A clock portion 240 is formed of, e.g., a counter for clocking time. A display portion 250 is formed of, e.g., a liquid crystal display for displaying a clock, an operation image, a selection image, and so forth. An input/output portion 260 is used for an operator to input or edit data of various kinds, such as process recipes, and for outputting data of various kinds, such as process recipes and process logs, to predetermined storage media. An alarm portion 270 is formed of, e.g., an alarm unit (such as a buzzer) for announcing occurrences of abnormalities, such as electric leakage in the processing system 100. Various controllers 280 are used for controlling respective portions of the processing system 100. The storage portion 290 is formed of, e.g., a hard disc drive (HDD).

The CPU 210 is connected, through bus lines, such as a control bus and a data bus, to the ROM 220, RAM 230, clock portion 240, display portion 250, input/output portion 260, alarm portion 270, various controllers 280, and storage portion 290.

The various controllers 280 include a controller 282 for controlling an operation of the transfer apparatus 170, and a controller 284 for controlling an operation of the transfer apparatus 180. The various controllers 280 further include a controller for the orientor 136, and controllers for controlling respective portions of the process chambers 140A to 140F (e.g., the switching valves of the gas supply systems and the switching valve of the exhaust system for each of the process chambers 140A to 140F).

The controllers 282 and 284 are connected to motor drives for driving the motors of the transfer apparatuses 170 and 180, respectively. The motor drives are connected to encoders disposed in the motors.

Figure 4:
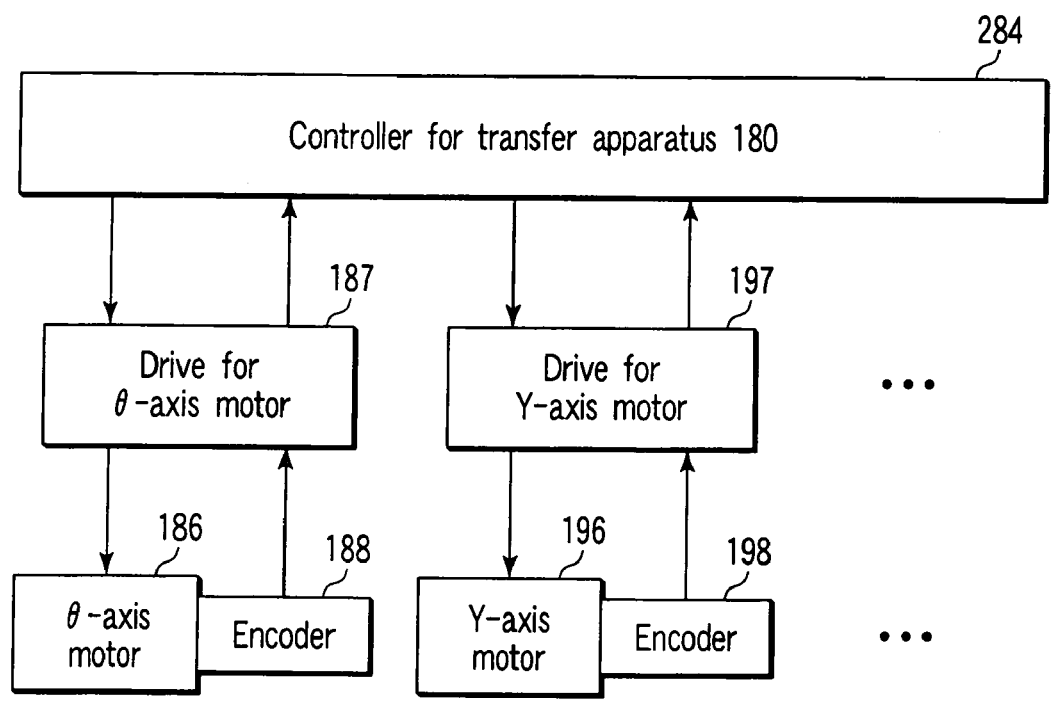
FIG. 4 is a block diagram showing a mechanism for controlling an operation of the transfer apparatus shown in FIG. 2A.

FIG. 4 is a block diagram showing a mechanism for controlling an operation of the transfer apparatus 180. The controller 284 is connected to an encoder 188 disposed in the θ-axis motor 186 through a drive 187 for driving the motor 186. The controller 284 is also connected to an encoder 198 disposed in the Y-axis motor 196 through a drive 197 for driving the motor 196. The controller 284 is further connected to the other motors (such as the motors for rectilinear motion and vertical motion) through their drives.

The controller 284 generates pulse signals for the respective motors in accordance with, e.g., motor drive instructions from the CPU 210. For example, pulse signals for controlling each transfer arm for position in the Y-axis direction and for orientation in the θ-axis direction are generated with reference to pattern model data 292 and track model data 294 described later, and are transmitted to the drives 187 and 197. The pulse signals are respectively converted into motor drive currents (or motor drive voltages) by the drives 187 and 197, and are supplied to the motors 186 and 196. The motors 186 and 196 are thereby respectively driven to cause the transfer apparatus 180 to swing and slide.

The outputs from the encoders of the motors 186 and 196 and so forth are transmitted to the controller 284 through the drives 187 and 197 and so forth. Consequently, the motors are respectively controlled by feed-back control, and the situations of the motors are respectively detected.

Depending on the type of motors, an encoder may be used or not used. For example, where a servo motor is used as a motor for driving each of the transfer apparatuses 170 and 180, an encoder is preferably attached thereto. However, where a stepping motor is used, an encoder may be attached or not attached thereto.

The storage portion 290 stores data for controlling respective portions of the processing system 100, such as the transfer apparatuses 170 and 180. Of the data, an explanation will be given of data for controlling an operation of the transfer apparatus 180. For example, as data for controlling an operation of the transfer apparatus 180, the storage portion 290 stores pattern model data 292 and track model data 294 for controlling the position and orientation of the transfer arms.

The pattern model data 292 is arranged to include swing and slide motions of the transfer apparatus 180 categorized into a plurality of motion patterns. The track model data 294 is arranged to include time-based motion tracks (swing motion tracks and slide motion tracks) of the transfer apparatus 180, which respectively correspond to the motion patterns included in the pattern model data 292. The pattern model data 292 and track model data 294 will be described later in detail.

(Motion Pattern of Transfer Apparatus)

For example, where a wafer process is performed by the transfer apparatus 180 disposed in the common transfer chamber 150, transfer patterns (motion patterns) of a wafer from an original position to a destination position are limited between chambers selected from the load-lock chambers 160M and 160N and process chambers 140A to 140F. Further, the motion patterns of each transfer arm for position in the Y-axis direction and orientation in the θ-axis direction are determined, depending on the position and orientation of the respective chambers. Accordingly, the motion patterns of the transfer apparatus 180 can be categorized into finite motion patterns.

The motion patterns are roughly categorized into main motion patterns relating to wafer processes, and non-main motion patterns in relation to operations, such as maintenance, other than the wafer processes. Of these motion patterns, the main motion patterns are important, because they are directly related to devices manufactured on wafers. Accordingly, the main motion patterns are further categorized into groups, and are provided with optimum time-based motion tracks (e.g., expressed by dimensionless positional parameters shown in FIGS. 18 to 20, as described later). Then, each of the transfer arms is operated with accelerations and maximum velocities determined in accordance with the time-based motion tracks, so that wafers are stably transferred and the throughput is improved.

Figure 14:
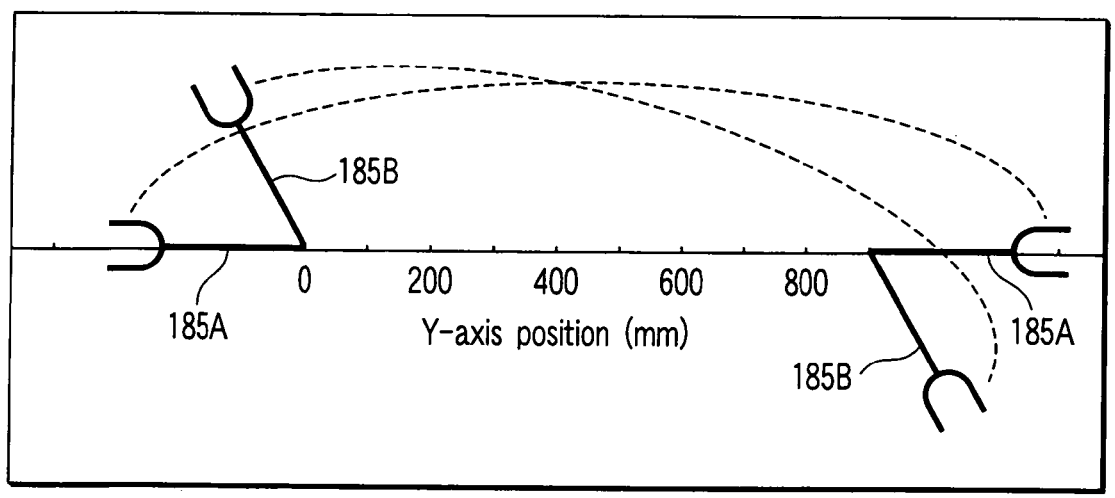
FIG. 14 is a view schematically showing a motion pattern of the transfer apparatus shown in FIG. 2A where control is conducted by the positional parameters shown in FIG. 12.

On the other hand, the non-main motion patterns are not related to the throughput of wafer processes, and thus they are not necessarily further divided into groups. In this case, a time-based motion track of only one type may be preset and used to ensure reliability for any motion, (for example, the time-based motion track may be preset in accordance with the severest motion pattern, as shown in FIG. 14 described later). Then, each of the transfer arms is operated with a certain acceleration and maximum velocity determined in accordance with this time-based motion track of one type (e.g., expressed by dimensionless positional parameters shown in FIG. 12).

The number of main motion patterns and the types thereof vary depending on the wafer process, the processing system structure (e.g., the number of process chambers, the types thereof, and the position thereof), and the number of picks of the transfer apparatus. Accordingly, the main motion patterns are preferably determined with reference to these conditions. The main motion patterns may include not only composite motions of swing motions and slide motions but also non-composite motions thereof, depending on the processing system structure.

Thus, the processing system according to this embodiment should be studied, focusing on the main motion patterns. In the processing system 100 shown in FIG. 1, the number of chambers connected to the common transfer chamber 150 is eight in total. Further, the number of transfer arms disposed in the common transfer chamber 150 is two in total, i.e., the first and second transfer arms 185A and 185B. With this arrangement, the conceivable main motion patterns should include the following patterns.

For example, a process is assumed such that a wafer W is transferred from one of the load-lock chambers 160M and 160N to one of the process chambers 140A to 140F, where the wafer is processed, and then the wafer W is transferred from that one of the process chambers 140A to 140F to one of the load-lock chambers 160M and 160N. In this case, it is thought that the main motion patterns include patterns in each of which one of the transfer arms 185A and 185B is operated to change the position and orientation from those for accessing one of the chambers (i.e., the position and orientation are set to transfer a wafer W by extending/retracting said one of the transfer arms 185A and 185B) to those for accessing another one of the chambers.

Further, a process is assumed such that one of the transfer arms supports a non-processed wafer W while the other of the transfer arms is used to pick up a processed wafer, so as to exchange it with the non-processed wafer W. In this case, it is thought that the main motion patterns include patterns in each of which one of the transfer arms is set at a position and an orientation for accessing one of the chambers, and then the other of the transfer arms is set at a position and an orientation for accessing another one of the chambers.

Next, an explanation will be given of some specific examples of the main motion patterns with reference to drawings. For this explanation, it is assumed that the first transfer arm 185A is operated to change the position and orientation from those for accessing one of the load-lock chambers 160M and 160N to those for accessing one of the process chambers 140A to 140F. Further, it is assumed that the first transfer arm 185A is operated to change the position and orientation from those for accessing one of the process chambers 140A to 140F to those for accessing one of the load-lock chambers 160M and 160N.

Figure 5:
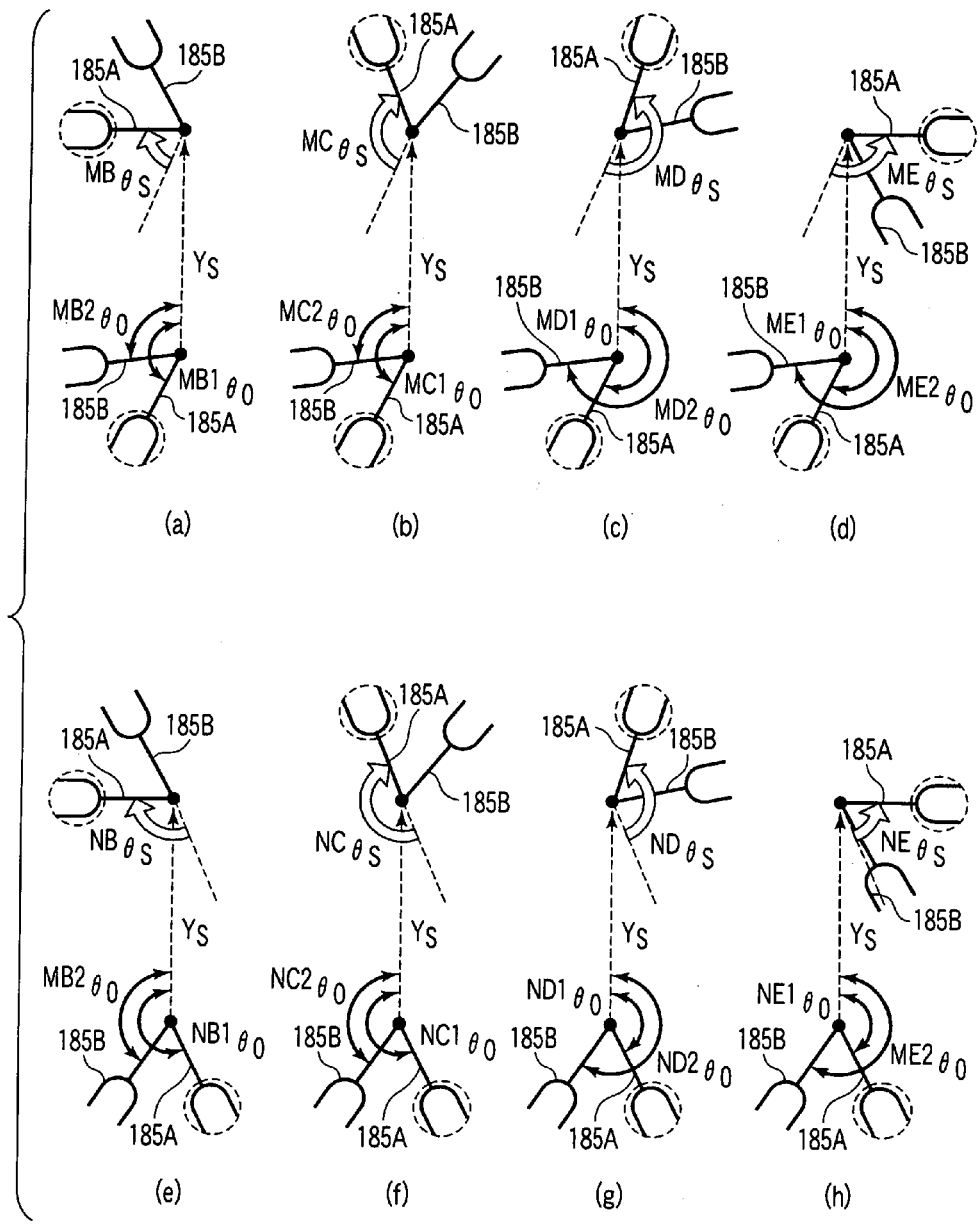
FIG. 5 is a view schematically showing motion patterns of the transfer apparatus shown in FIG. 2A.
Figure 6:
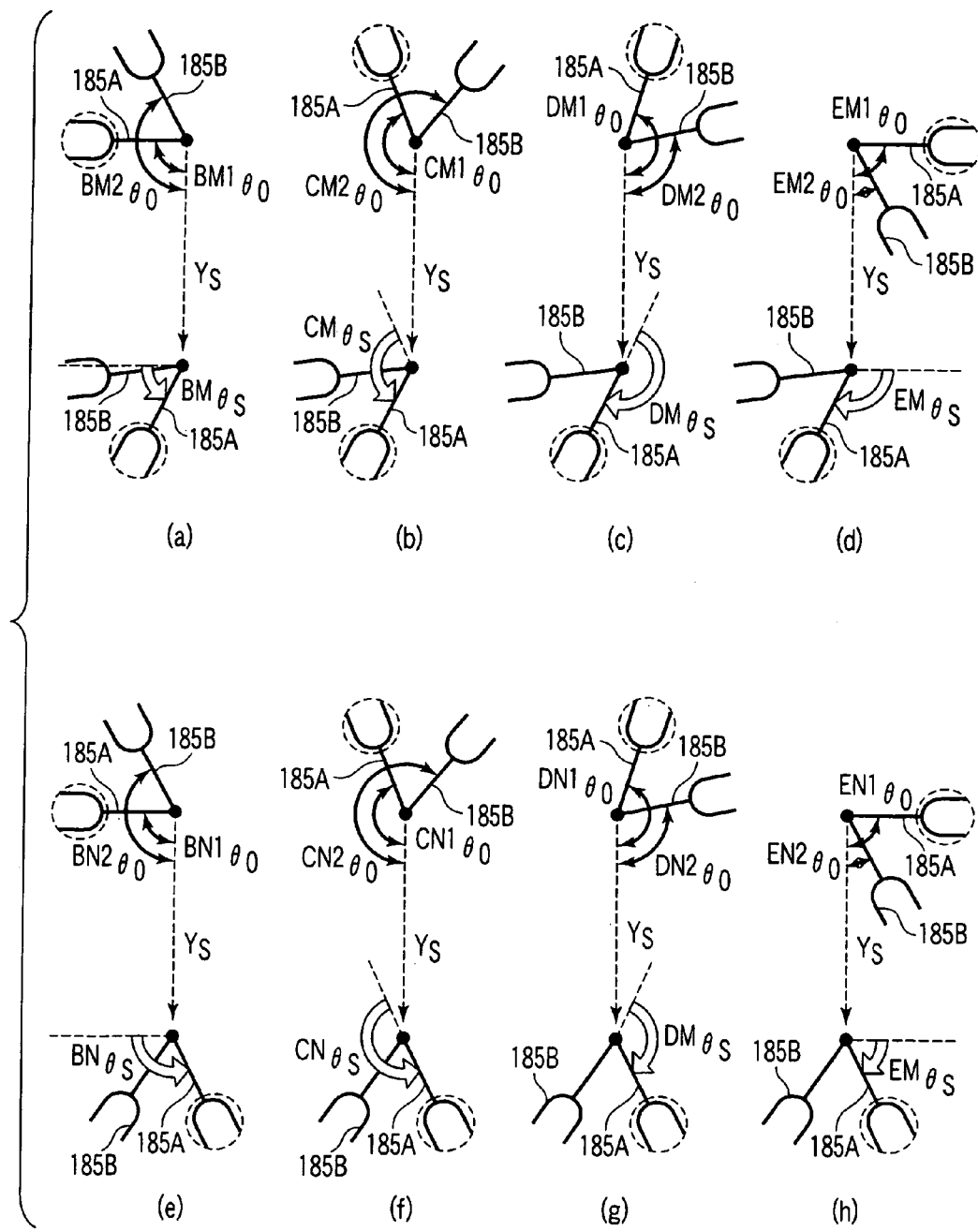
FIG. 6 is a view schematically showing other motion patterns of the transfer apparatus shown in FIG. 2A.
Figure 7:
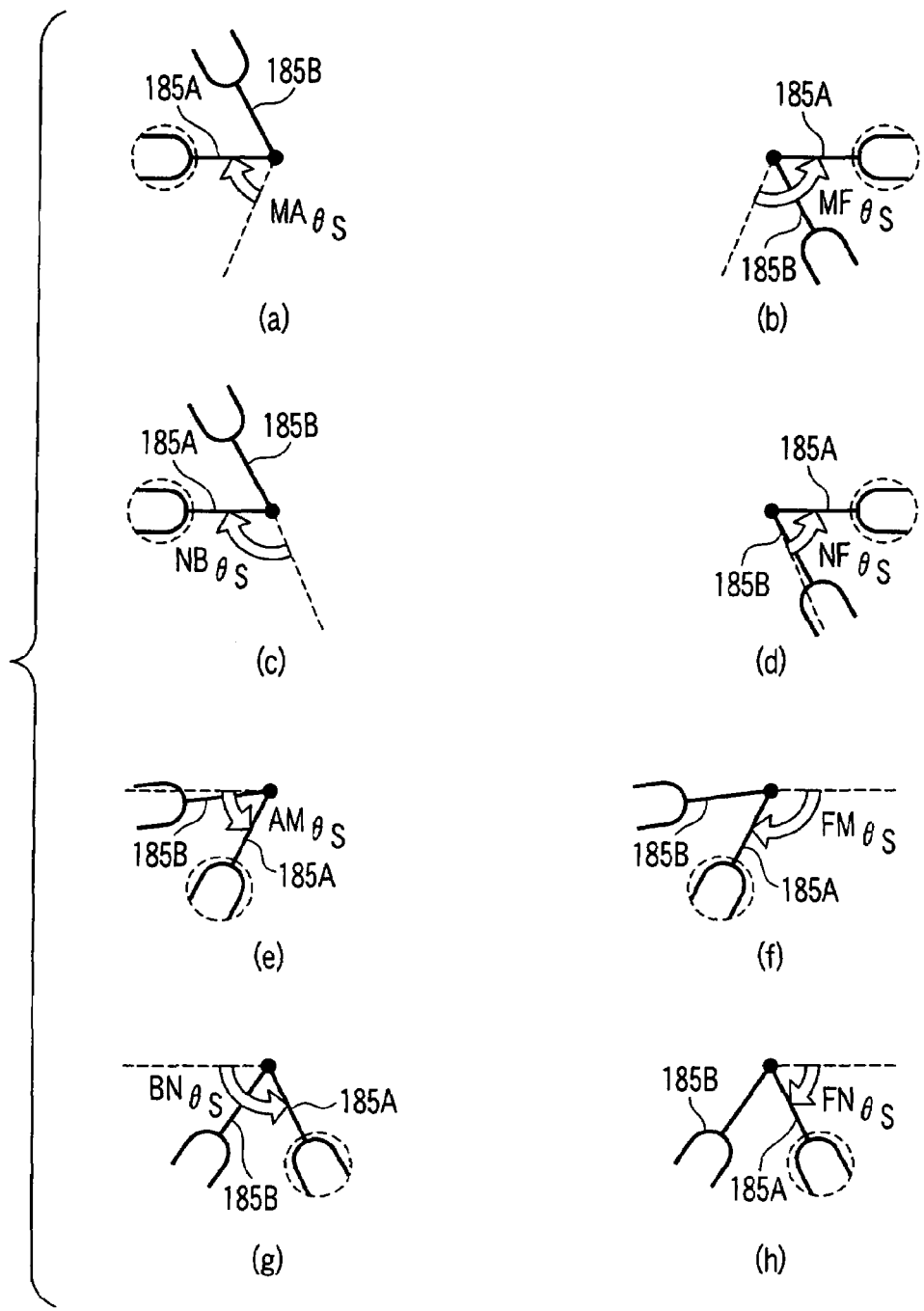
FIG. 7 is a view schematically showing other motion patterns of the transfer apparatus shown in FIG. 2A.

FIGS. 5 to 7 are views schematically showing motion patterns of the transfer apparatus 180 (from a start position to a terminal position). FIG. 5 shows motion patterns where the first transfer arm 185A is operated to change the position and orientation from those for accessing one of the load-lock chambers 160M and 160N to those for accessing one of the process chambers 140B to 140E. FIG. 6 shows motion patterns where the transfer arm 185A is operated to change the position and orientation from those for accessing one of the process chambers 140B to 140E to those for accessing one of the load-lock chambers 160M and 160N. FIG. 7 shows motion patterns where the transfer arm 185A is operated to change the orientation between that for accessing one of the load-lock chambers 160M and 16ON and that for accessing one of the process chambers 140A and 140F. Each of the motion patterns shown in FIGS. 5 and 6 requires a composite motion of a swing motion and a slide motion. On the other hand, each of the motion patterns shown in FIG. 7 requires only a swing motion. FIGS. 5 to 7 are respectively shown in accordance with the coordinate axes shown in FIG. 2B.

In FIG. 5, (a) to (d), the first transfer arm 185A is moved from the load-lock chamber 160M to the process chambers 140B to 140E, respectively. Accordingly, in FIG. 5, (a) to (d), the motion stroke in the θ-axis (swing motion) is expressed with $^{MB}\theta_S$, $^{MC}\theta_S$, $-^{MD}\theta_S$, and $-^{ME}\theta_S$, respectively. In FIG. 5, (a) to (d), the motion stroke in the Y-axis (slide motion) is expressed with $Y_S$ for all the cases. In FIG. 5, (a) to (d), the swing start angle of the first transfer arm 185A in the θ-axis (swing motion) is expressed with $^{MB1}\theta_0$, $^{MC1}\theta_0$, $^{MB1}\theta_0$, and $^{ME1}\theta_0$, respectively. Further, the swing start angle of the second transfer arm 185B is expressed with $^{MB2}\theta_0$, $^{MC2}\theta_0$, $^{MD2}\theta_0$, and $^{ME2}\theta_0$, respectively. In FIG. 5, (a) to (d), the start position in the Y-axis (slide motion) is expressed with 0 for all the cases.

In FIG. 5, (e) to (h), the first transfer arm 185A is moved from the load-lock chamber 160N to the process chambers 140B to 140E, respectively. Accordingly, in FIG. 5, (e) to (h), the motion stroke in the θ-axis (swing motion) is expressed with $^{NB}\theta_S$, $^{NC}\theta_S$, $-^{ND}\theta_S$, and $-^{NE}\theta_S$, respectively. In FIG. 5, (e) to (h), the motion stroke in the Y-axis (slide motion) is expressed with $Y_S$ for all the cases. In FIG. 5, (e) to (h), the swing start angle of the first transfer arm 185A in the θ-axis (swing motion) is expressed with $^{NB1}\theta_0$, $^{NC1}\theta_0$, $^{ND1}\theta_0$, and $^{NE1}\theta_0$, respectively. Further, the swing start angle of the second transfer arm 185B is expressed with $^{NB2}\theta_0$, $^{NC2}\theta_0$, $^{ND2}\theta_0$, and $^{NE2}\theta_0$, respectively. In FIG. 5, (e) to (h), the start position in the Y-axis (slide motion) is expressed with 0 for all the cases.

In FIG. 6, (a) to (d), the first transfer arm 185A is moved from the process chambers 140B to 140E to the load-lock chamber 160M, respectively. Accordingly, in FIG. 6, (a) to (d), the motion stroke in the θ-axis (swing motion) is expressed with $-^{BM}\theta_S$, $-^{CM}\theta_S$, $^{DM}\theta_S$, and $^{EM}\theta_S$, respectively. In FIG. 6, (a) to (d), the motion stroke in the Y-axis (slide motion) is expressed with $-Y_S$ for all the cases. In FIG. 6, (a) to (d), the swing start angle of the first transfer arm 185A in the θ-axis (swing motion) is expressed with $^{BM1}\theta_0$, $^{CM1}\theta_0$, $^{DM1}\theta_0$, and $^{EM1}\theta_0$, respectively. Further, the swing start angle of the second transfer arm 185B is expressed with $^{BM2}\theta_0$, $^{CM2}\theta_0$, $^{DM2}\theta_0$, and $^{EM2}\theta_0$, respectively. In FIG. 6, (a) to (d), the start position in the Y-axis (slide motion) is expressed with $Y_S$ for all the cases.

In FIG. 6, (e) to (h), the first transfer arm 185A is moved from the process chambers 140B to 140E to the load-lock chamber 160N, respectively. Accordingly, in FIG. 6, (e) to (h), the motion stroke in the θ-axis (swing motion) is expressed with $-^{BN}\theta_S$, $-^{CN}\theta_S$, $^{DN}\theta_S$, and $^{EN}\theta_S$, respectively. In FIG. 6, (e) to (h), the motion stroke in the Y-axis (slide motion) is expressed with $-Y_S$ for all the cases. In FIG. 6, (e) to (h), the swing start angle of the first transfer arm 185A in the θ-axis (swing motion) is expressed with $^{BN1}\theta_0$, $^{CN1}\theta_0$, $^{DN1}\theta_0$, and $^{EN1}\theta_0$, respectively. Further, the swing start angle of the second transfer arm 185B is expressed with $^{BN2}\theta_0$, $^{CN2}\theta_0$, $^{DN2}\theta_0$, and $^{EN2}\theta_0$, respectively. In FIG. 6, (e) to (h), the start position in the Y-axis (slide motion) is expressed with $Y_S$ for all the cases.

In FIGS. 7, (a) and (b), the first transfer arm 185A is moved from load-lock chamber 160M to the process chambers 140A and 140F, respectively. Accordingly, in FIGS. 7, (a) and (b), the motion stroke in the θ-axis (swing motion) is expressed with $^{MA}\theta_S$ and $-^{MF}\theta_S$, respectively. In FIGS. 7, (c) and (d), the first transfer arm 185A is moved from load-lock chamber 160N to the process chambers 140A and 140F, respectively. Accordingly, in FIGS. 7, (c) and (d), the motion stroke in the θ-axis (swing motion) is expressed with $^{NA}\theta_S$ and $-^{NF}\theta_S$, respectively.

In FIGS. 7, (e) and (f), the first transfer arm 185A is moved from the process chambers 140A and 140F to the load-lock chamber 160M, respectively. Accordingly, in FIGS. 7, (e) and (f), the motion stroke in the θ-axis (swing motion) is expressed with $-^{AM}\theta_S$ and $^{FM}\theta_S$, respectively. In FIGS. 7, (g) and (h), the first transfer arm 185A is moved from the process chambers 140A and 140F to the load-lock chamber 160N, respectively. Accordingly, in FIGS. 7, (g) and (h), the motion stroke in the θ-axis (swing motion) is expressed with $-^{AN}\theta_S$ and $^{FN}\theta_S$, respectively. In FIG. 7, (*a*) to (*h*), the motion stroke in the Y-axis (slide motion) is expressed with 0 for all cases, because no slide motion is required.

FIGS. 8 and 9 are views showing lists of the motion patterns shown in FIGS. 5 to 7. FIG. 8 shows cases where the first transfer arm 185A is moved from one of load-lock chambers 160M and 160N (an original position) to one of the process chambers 140A to 140F (a destination position). These cases correspond to those shown in FIG. 5, (*a*) to (*h*) and FIG. 7, (*a*) to (*d*). On the other hand, FIG. 9 shows cases where the first transfer arm 185A is moved from one of the process chambers 140A to 140F (an original position) to one of load-lock chambers 160M and 160N (a destination position). These cases correspond to those shown in FIG. 6, (*a*) to (*h*) and FIG. 7, (*e*) to (*h*). Although, in these cases, the original positions and destination positions are exemplified by chambers, such as the process chambers 140 and load-lock chambers 160, an original position or destination position may be an area for a wafer to temporarily wait inside the common transfer chamber 150. Further, an original position or destination position may be an area inside the common transfer chamber 150, which is provided with a positional sensor for correcting misalignment of a wafer on a transfer arm.

Of the main motion patterns described above, each of the motion patterns shown in FIGS. 5 and 6 requires not only a swing motion but also a slide motion. In this case, if one of the swing motion and slide motion is first performed and the other of the motions is then performed, the wafer transfer time period is prolonged. Accordingly, for example, a composite motion is preferably performed such that the swing motion and slide motion are simultaneously started and simultaneously terminated.

However, where a transfer arm simultaneously performs a swing motion and a slide motion, a wafer on the transfer arm receives a composite acceleration formed of an acceleration due to the swing motion (swing acceleration) and an acceleration due to the slide motion (slide acceleration). In this case, even if each of the accelerations respectively due to the swing and slide motions is set to be less than a permissible limit (e.g., permissible maximum acceleration or permissible maximum acceleration change rate), the composite acceleration created by the two motions may exceed the permissible limit. Reversely, the composite acceleration created by the two motions may be far less than the permissible limit, and thereby bring about a very large value of the acceleration margin. In other words, in this latter case, although the transfer time period can be further shorted, this chance is wasted.

Specifically, for example, where a swing motion and a slide motion are accelerated (or decelerated), the slide acceleration is generated in a linear direction while the swing acceleration is generated in a circular direction and affects the slide acceleration differently with time. Accordingly, depending on the motion patterns of composite motions formed of swing and slide motions, the accelerations of the swing and slide motions may act to enhance each other or attenuate (or cancel) each other. Where a swing acceleration and a slide acceleration enhance each other, the maximum value of the composite acceleration applied to a wafer may exceed a permissible limit and impart a shock or vibration to the wafer. Reversely, where a swing acceleration and a slide acceleration attenuate (or cancel) each other, the maximum value of the composite acceleration applied to a wafer becomes small, and thus the transfer time period can be shortened by increasing the acceleration.

In light of the aspect described above, according to this embodiment, the main motion patterns are categorized into groups and stored as pattern model data 292. Further, time-based motion tracks are respectively preset for the motion patterns of the pattern model data 292, and stored as track model data 294. With such data, optimum operational control is performed in accordance with each of the motion patterns, so that wafers are stably transferred with a higher velocity to shorten the transfer time period, thereby improving the throughput.

(Pattern Model Data and Track Model Data)

FIGS. 10 and 11 are views showing examples of the pattern model data 292 and track model data 294. FIG. 10 shows data of the main motion patterns shown in FIGS. 5 and 6 described above, wherein they are categorized into groups. FIG. 11 shows data of positional parameters used for calculating time-based motion tracks preset respectively for the motion patterns shown in FIG. 10. The main motion patterns shown in FIGS. 5 and 6 are categorized into eight motion pattern groups, as shown in FIG. 10, in light of the positional symmetry of the load-lock chambers 160M and 160N and process chambers 140A to 140F.

For example, in the processing system 100 shown in FIG. 1, the load-lock chamber 160M and process chamber 140A to 140C are disposed line-symmetrical with the load-lock chamber 160N and process chamber 140D to 140F. Accordingly, for example, where the operation only of the first transfer arm 185A is considered, the motion strokes and swing start angles in the θ-axis shown in FIGS. 5, (*a*), (*b*), (*c*) and (*d*), are the same as those shown in FIGS. 5, (*h*), (*g*), (*f*) and (*e*), respectively. Further, the motion strokes and start positions in the Y-axis shown in FIG. 5, (*a*) to (*h*), are all the same. Accordingly, the motion patterns shown in FIG. 5 can be categorized into four pattern groups. On the other hand, the motion strokes and swing start angles in the θ-axis shown in FIGS. 6, (*a*), (*b*), (*c*), and (*d*), are the same as those shown in FIGS. 6, (*h*), (*g*), (*f*) and (*e*), respectively. Further, the motion strokes and start positions in the Y-axis shown in FIG. 6, (*a*) to (*h*), are all the same. Accordingly, the motion patterns shown in FIG. 6 can also be categorized into four pattern groups. Consequently, the motion patterns shown in FIGS. 5 and 6 each including four pattern groups provide eight pattern groups in total.

If the load-lock chambers 160M and 160N are disposed line-symmetrical with the process chambers 140C and 140D, the motion strokes and swing start angles in the θ-axis shown in FIGS. 5, (*b*) and (*g*), become the same as those shown in FIGS. 6, (*b*) and (*g*). Further, the motion strokes and swing start angles in the θ-axis shown in FIGS. 5, (*c*) and (*f*), become the same as those shown in FIGS. 6, (*c*) and (*f*). Accordingly, in this case, the motion patterns can be categorized into six pattern groups in total.

As shown in FIG. 10, motion patterns P1 to P8 are preset, where the first transfer arm 185A is used to transfer one wafer W. In addition to the motion patterns P1 to P8, the pattern model data 292 may include motion patterns in accordance with the number of wafers and the presence and absence of wafers on the transfer arms. Specifically, for example, additional motion patterns may be preset for a case where the first and second transfer arms 185A and 185B support two wafers W and/or a case where they support no wafers. Depending on the number of wafers and the presence and absence of wafers to be transferred, the weight (loaded condition) on the transfer arms varies and thus changes the acceleration of each motion and the composite acceleration. Accordingly, in light of these factors, the motion patterns can be suitably categorized into groups, which are then provided with optimum time-based motion tracks.

Further, additional motion patterns may be preset for other modes, such as a maintenance mode and initialization mode, in addition to the normal mode for performing predetermined processes on wafers. Since the maintenance mode and initialization mode include no wafer processes, it is unnecessary for them to further categorize time-based motion tracks, as in the normal mode. Accordingly, in addition to motion patterns for the normal mode, a time-based motion track of only one type may be preset for these cases in accordance with the severest motion pattern, for example, as shown in FIG. 14 described later. Then, each of the transfer arms is operated with a certain acceleration and maximum velocity determined in accordance with this time-based motion track of one type (e.g., expressed by dimensionless positional parameters shown in FIG. 12).

Further, as shown in FIG. 10, an additional motion pattern Pm may be preset for cases to which the eight motion patterns P1 to P8 cannot be applied. With this arrangement, it is possible to handle such cases with a motion pattern other than the eight motion patterns P1 to P8.

In the example shown in FIG. 10, the pattern model data 292 is arranged to categorize the motion patterns shown in FIGS. 5 and 6 into groups in accordance with respective motions. However, the pattern model data 292 may be arranged to categorize the motion patterns in different ways. For example, a plurality of similarity ranges may be preset for at least one of the swing start angle and respective motion strokes to categorize the motion patterns. Where similarity ranges are preset respectively for the swing start angle and motion strokes of swing motions, the motion patterns can be categorized in accordance with combinations of the ranges. In this case, where the composite accelerations of swing and slide motions form similar curved lines, they can be categorized into the same motion pattern group. Consequently, the motion patterns can be suitably categorized into a smaller number of groups.

FIG. 11 shows an example of the track model data 294 including time-based motion tracks respectively corresponding to the categorized motion patterns. In FIG. 11, the track model data 294 is arranged such that the time-based motion tracks in the θ-axis or swing motion axis and the Y-axis or slide motion axis are expressed by positional parameters (position coefficients) that represent positions with time. As shown in FIG. 11, the track model data 294 includes data indicative of the operational time period $^{P}T$ of each motion pattern P from the start position to the terminal position in each axis, and data indicative of the positional parameters ($^{P}\theta_Q$, $^{P}Y_Q$) along with time Q. For example, in the case the motion pattern Pi of an ordinal number i, the positional parameters at time Qj are expressed with ($^{Pi}\theta_{Qj}$, $^{Pi}Y_{Qj}$). In this formula, I=1 to m, and j=1 to n, where m denotes the number of motion pattern groups in the pattern model data 292, and n is the number (e.g., n=30) of divisions of each motion stroke equally divided from the start position to the terminal position in each axis.

Figures 12, 13:
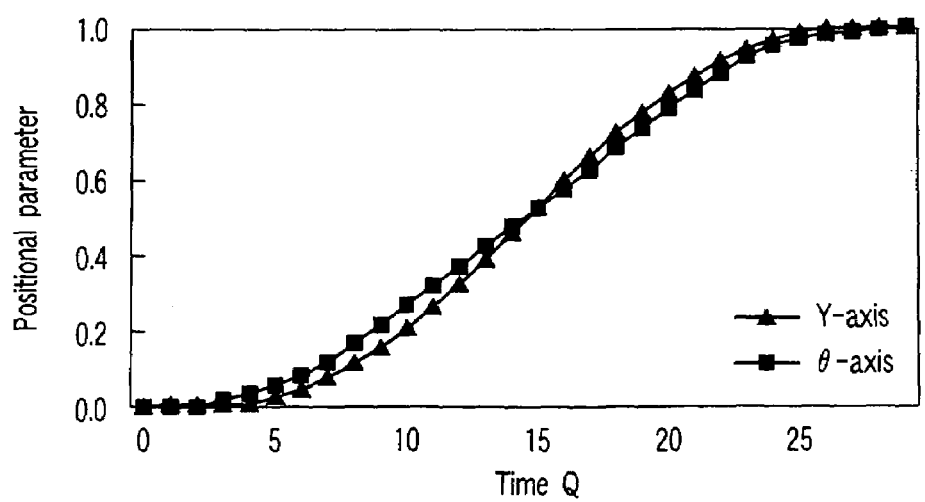
FIG. 12 is a view showing an example of track model data expressed by dimensionless positional parameters where the transfer apparatus shown in FIG. 2A is controlled by S-type drive.
FIG. 13 is a graph showing a time-based motion track expressed by positional parameters in the θ-axis and Y-axis shown in FIG. 12.

As shown in FIG. 11, the time Q and positional parameters ($^{P}\theta_Q$, $^{P}Y_Q$) may be formed of actual time and positional parameters of each time-based motion track, or formed of dimensionless parameters thereof. Where the dimensionless parameters are used, for example, as shown in FIG. 12 described later, the motion stroke in each axis is expressed with a range of 0 to 1. Then, this stroke from the start position "0" to the terminal position "1" is divided by a predetermined number n (e.g., n=30), and values from 0 to 1 thus obtained are used as a positional parameter for representing positions along with values of divided time Q. With this arrangement, an actual time point (predetermined time point) of each time-based motion track can be calculated by multiplying the operational time period $^{P}T$ with a time Qj. Further, a positional point of the time-based motion track can be calculated by multiplying the motion strokes in the respective axes with positional parameters ($^{Pi}\theta_{Qj}$, $^{Pi}Y_{Qj}$). Where dimensionless positional parameters are thus used, the time-based motion tracks can be easily calculated from the motion strokes and operational time period. In this case, for example, even if the motion stroke and operational time period are affected by design changes, the same positional parameters are still usable. Further, even if transfer apparatus have different motion strokes and operational time periods, the same positional parameters are usable for them.

Specifically, for example, in the track model data 294 shown in FIG. 11, dimensionless positional parameters are expressed with ($^{Pi}\theta_{Qj}$, $^{Pi}Y_{Qj}$) along with time Qi. Where $\theta_S$ and $Y_S$ denote the motion strokes in the θ-axis and Y-axis from the start position to the terminal position, and $^{Pi}T$ denotes the operational time period, the time-based motion track of the motion pattern Pi is expressed, as follows. Specifically, each time point in the operational time period $Pi_T$ is expressed with ($^{Pi}T/n)\times Qj$, and positions in the θ-axis and Y-axis at this time are expressed with ($\theta_S\times^{Pi}\theta_{Qi}$, $Y_S\times^{Pi}Y_{Qi}$). The track data thus derived is used to control the transfer apparatus 180 for the motions in the θ-axis and Y-axis.

The track model data 294 is preferably arranged such that each of the time-based motion tracks is preset to cause a motion and a motion change of each of the transfer arm 185A and 185B to be continuous. In this respect, the positional parameters may be preset in accordance with various drive forms, such as trapezoidal drive and S-type drive. The trapezoidal drive is a drive form also referred to as uniformly accelerating drive, in which the velocity is linearly increased, then held constant after reaching the constant value, and then linearly decreased. On the other hand, the S-type drive is a drive form that causes the velocity to be smoothly increased, then held constant after reaching the constant value, and then smoothly decreased. The trapezoidal drive brings about a discontinuous acceleration, while the S-type drive brings about a continuous acceleration. Accordingly, the S-type drive allows the drive to be stable with less shock, as compared to the trapezoidal drive. For this reason, according to this embodiment directed to a transfer apparatus for transferring a wafer, the S-type drive is preferably used to control the transfer apparatus.

FIG. 12 is a view showing an example of track model data expressed by dimensionless positional parameters where the transfer apparatus 180 is controlled by S-type drive. In FIG. 12, the motion stroke in each of the θ-axis and Y-axis is expressed with 0 to 1 to obtain dimensionless positional parameters. For example, the motion stroke of 0 to 1 in each of the θ-axis and Y-axis is performed within $^{Pm}T=2.32$ sec. FIG. 13 is a graph showing a time-based motion track expressed by positional parameters in the θ-axis and Y-axis shown in FIG. 12.

In the example shown in FIG. 12, actual positional points of the time-based motion track in the respective axes can be calculated by multiplying the motion strokes $\theta_S$ and $Y_S$ in the axes with positional parameters in the axes. Further, the actual time-based motion track of the transfer arm is obtained by combining the actual positional points in the respective axes.

FIG. 14 is a view schematically showing a motion pattern of the transfer apparatus 180 where control is conducted by the positional parameters shown in FIG. 12. In the motion pattern shown in FIG. 14, the first transfer arm 185A is moved from a swing start angle $\theta_0$ of 180° (degree) in the θ-axis and a start position $Y_0$ of 0 in the Y-axis to have a motion stroke $\theta_S$ of 180° (degree) in the θ-axis and a motion stroke $Y_S$ of 870 mm in the Y-axis. The motion pattern shown in FIG. 14 is not included in the motion patterns shown I FIGS. 5 and 6. For example, this motion pattern corresponds to the motion pattern Pm in the pattern model data 292 shown in FIG. 10, to which the motion patterns P1 to P8 cannot be applied. The motion pattern shown in FIG. 14 is the severest motion pattern in which the first transfer arm 185A is operated with the largest motion strokes in the respective axes while the directions of the swing and slide motions overlap each other.

Figure 15A:
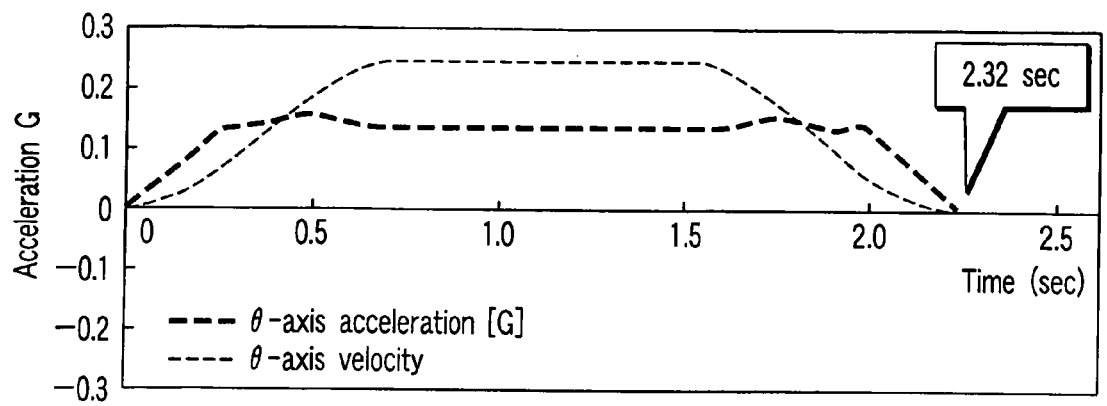
FIG. 15A is a graph showing velocity and acceleration in the θ-axis where control is conducted by the positional parameters shown in FIG. 12.
Figure 15B:
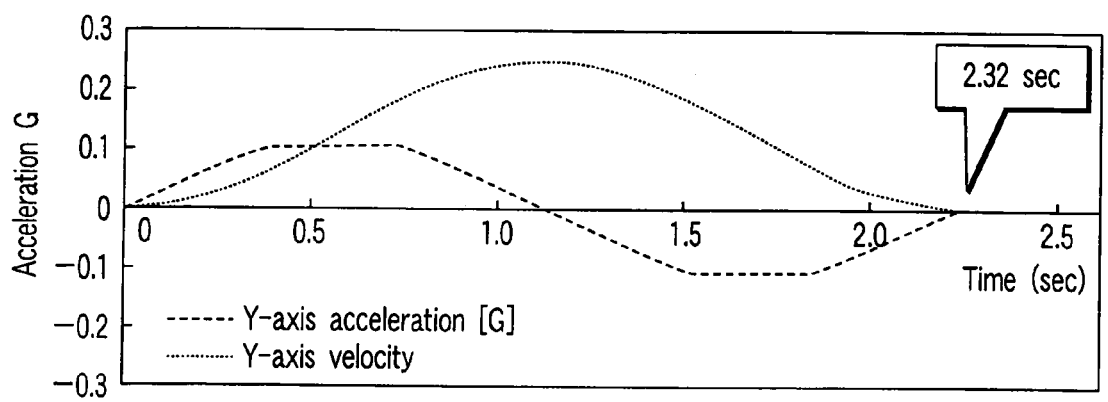
FIG. 15B is a graph showing velocity and acceleration in the Y-axis where control is conducted by the positional parameters shown in FIG. 12.
Figure 15C:
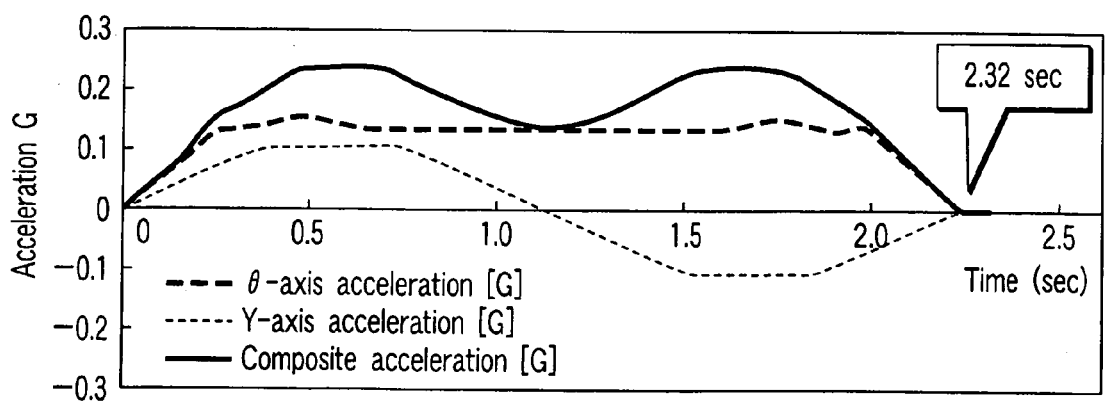
FIG. 15C is a graph showing acceleration in the θ-axis and Y-axis and composite acceleration thereof where control is conducted by the positional parameters shown in FIG. 12.

For example, where the transfer apparatus 180 is operated in accordance with the positional parameters in the respective axes shown in FIG. 12 to form the motion pattern shown in FIG. 14, the time-based motion tracks of the transfer arms are as shown with broken lines in FIG. 14. FIG. 15A shows the velocity and acceleration (e.g., a composite acceleration of a normal line acceleration and a tangent line acceleration) in the θ-axis obtained in this case. FIG. 15B shows the velocity and acceleration in the Y-axis obtained in this case. FIG. 15C shows the acceleration in the θ-axis, the acceleration in the Y-axis, and the composite acceleration thereof obtained in this case.

There are various methods for expressing the acceleration in the Y-axis, the acceleration in the Y-axis, and the composite acceleration thereof. In this embodiment, the following method is used to obtain the composite acceleration. Specifically, where a transfer arm is operated with a composite motion in the θ-axis and Y-axis, the position of the transfer arm at each of the predetermined time points (e.g., the position of the distal end of the transfer arm) is put on an orthogonal coordinate system (e.g., X-Y coordinate system). Then, the position in the X-direction of the orthogonal coordinate system is differentiated twice by time to obtain an X-axis acceleration. Further, the position in the Y-direction of the orthogonal coordinate system is differentiated twice by time to obtain a Y-axis acceleration. These X-axis acceleration and Y-axis acceleration are respectively squared and summed up to obtain a product. Then, the square root of this product is calculated to derive an acceleration again, which is used as the composite acceleration. This composite acceleration is an acceleration applied to a wafer on the transfer arm. Accordingly, as long as the composite acceleration does not exceed a predetermined permissible limit, the wafer can be stably transferred by the transfer arm.

The predetermined permissible limit of acceleration is preset to prevent a wafer being transferred from receiving an excessive shock or vibration. Examples of the permissible limit are a permissible acceleration that uses a preset acceleration degree, and a permissible acceleration change rate that uses a preset acceleration change rate. The permissible limit may be defined by one or both of the permissible acceleration and permissible acceleration change rate. For example, where the permissible limit is defined by a permissible acceleration, each time-based motion track in track model data is arranged such that the maximum value of the composite acceleration of swing and slide accelerations of the corresponding motion pattern does not exceed the permissible acceleration. The permissible acceleration is preferably preset at a suitable value with reference to not only the motion patterns, but also the structure of the transfer apparatus 180. For example, in this embodiment, the permissible limit is defined by a permissible acceleration of 0.25 G.

As described above, according to this embodiment, the time-based motion track, velocity, and acceleration are determined, depending on the positional parameters included in the track model data 294. Accordingly, the positional parameters need to be preset to prevent the composite acceleration from exceeding the permissible acceleration for each motion pattern of the pattern model data 292. Then, the transfer apparatus 180 can be controlled to perform a reliable operation for each motion pattern.

In this respect, as the transfer velocity is increased to shorten the transfer time period, the accelerations in the respective axes are increased by that much, and thus the composite acceleration is also increased. Accordingly, the positional parameters of the track model data 294 are preferably preset to obtain a higher velocity, thereby shortening the transfer time period, as long as the composite acceleration does not exceed the permissible acceleration. This allows the transfer apparatus 180 to be controlled to perform an optimum operation for each motion pattern.

The positional parameters shown in FIG. 12 described above are arranged to make the transfer time period shortest, while preventing the composite acceleration of the θ-axis and Y-axis shown in FIG. 15C from exceeding the permissible acceleration of 0.25 G during the motion stroke, (where the transfer apparatus 180 is operated in the motion pattern shown in FIG. 14). However, although the positional parameters are arranged to obtain the shortest transfer time period for the motion pattern shown in FIG. 14, if they are applied to another motion pattern with a different motion stroke or swing start angle, the shortest transfer time period cannot be obtained. Accordingly, for each motion pattern, the positional parameters are preferably preset to obtain the shortest transfer time period.

Figure 16:
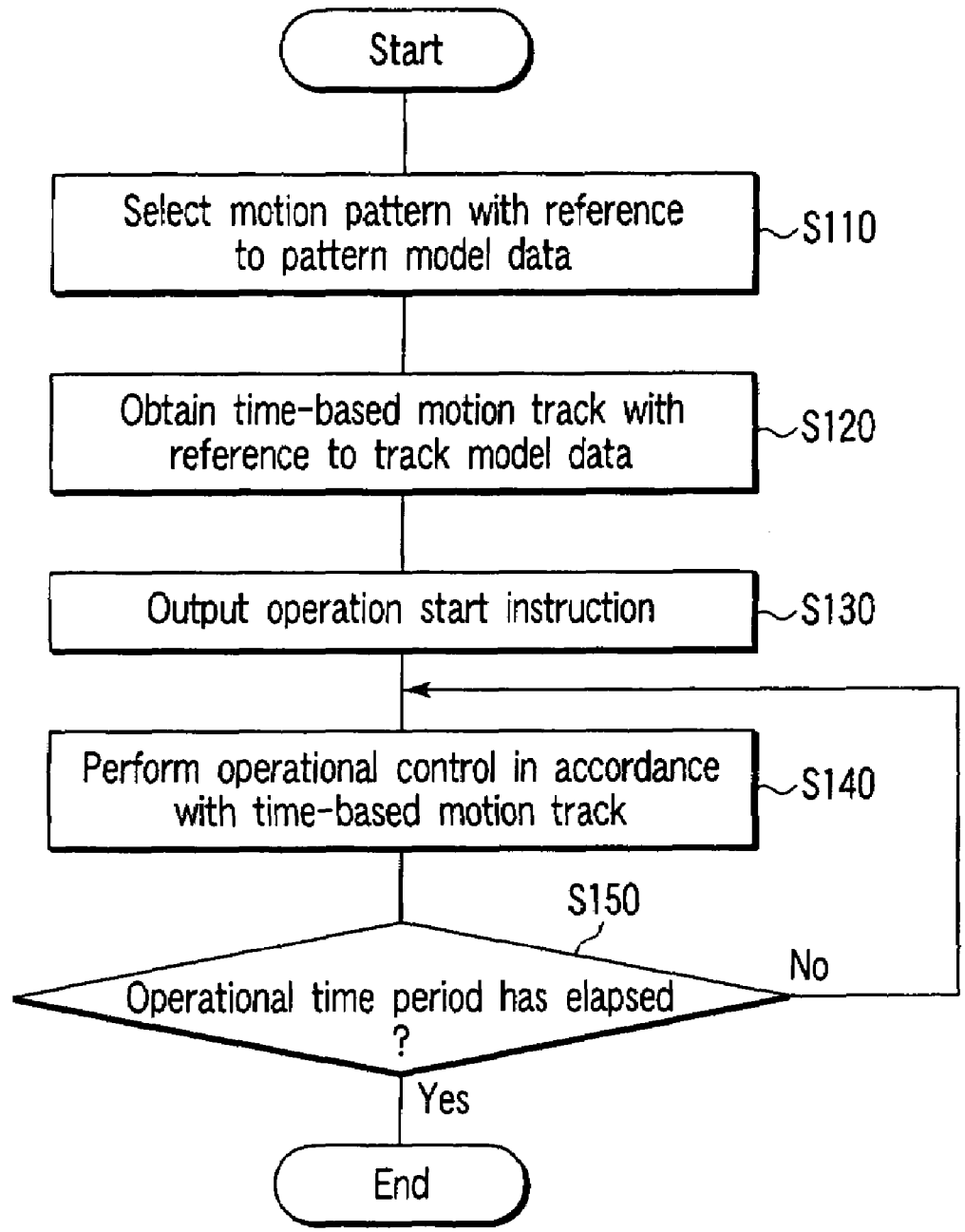
FIG. 16 is a flowchart showing a method for controlling the transfer apparatus shown in FIG. 2A.

FIG. 16 is a flowchart showing a method for controlling the transfer apparatus 180. In this example, the transfer apparatus 180 is controlled for the position in the Y-axis direction and the orientation in the θ-axis direction. For example, this control method is performed in accordance with program data (program data for controlling the transfer apparatus) stored in the ROM 220 or storage portion 290 of the control section 200.

When the transfer apparatus 180 is controlled to swing and slide, a motion pattern is first selected with reference to the pattern model data 292 in a step S110. Specifically, for example, in accordance with a swing start angle $\theta_0$ and motion strokes $\theta_S$ and $Y_S$, a corresponding motion pattern is retrieved and determined from, e.g., the pattern model data 292 shown in FIG. 10.

Then, in a step S120, a time-based motion track is obtained with reference to the track model data 294. Specifically, the positional parameters corresponding to the motion pattern selected in the step S110 are selected from, e.g., the track model data 294 shown in FIG. 11, and a time-based motion track is derived from the positional parameters. For example, where the positional parameters are dimensionless, as shown in FIG. 12, the following calculation may be performed, as described above. Namely, an actual time point (predetermined time point) of the time-based motion track is calculated by multiplying the operational time period $^{Pi}T$ with a time Qj. Further, a positional point of the time-based motion track is calculated by multiplying the motion strokes in the respective axes with positional parameters ($^{Pi}\theta_{Qj}$, $^{Pi}Y_{Qj}$). The time-based motion track is thus obtained from positional points in the respective axes at predetermined time points.

In a step S130, an operation start instruction of the transfer apparatus 180 is output, and, in a step S140, the transfer apparatus 180 is controlled in the θ-axis and Y-axis on the basis of the time-based motion track. For example, the operation start instruction is transmitted from the CPU 210 to the controller 284. Then, the positional parameters in the respective axes (θ-axis and Y-axis) along with time obtained in the step S120 are transmitted, as positional instruction values representing the time-based motion track, to the controller 284. Then, the controller 284 controls the θ-axis motor and Y-axis motor through the respective drives 187 and 197, in accordance with the positional instruction values in the respective axes (θ-axis and Y-axis).

Then, in a step S150, a judgment is made of whether the operational time period $^{P}T$ of the motion pattern P has elapsed. If it is judged that the operational time period $^{P}T$ has not yet elapsed in the step S150, the flow is returned to the step S140. If it is judged that the operational time period $^{P}T$ has elapsed, the operational control of the transfer apparatus 180 is finished.

(Experiment)

Next, an explanation will be given of an experimental result with reference to drawings, where the method described above was used to control an operation of the transfer apparatus 180. In this case, as in the motion patterns shown in FIGS. 5 to 7, the first transfer arm 185A, i.e., one of the transfer arms, is operated to change the position and orientation from those for accessing one of the chambers to those for accessing another one of the chambers. In this case, however, in addition to motion patterns where only the first transfer arm 185A supports a wafer W, motion patterns where only the second transfer arm 185 supports a wafer W are also considered.

These motion patterns have different values of the swing start angle. Specifically, where only the first transfer arm 185A supports a wafer W, the swing start angle is defined by that of the first transfer arm 185A. Where only the second transfer arm 185B supports a wafer W, the swing start angle is defined by that of the second transfer arm 185B. In this case, some of the motion patterns may have the same motion stroke and different motion patterns. Accordingly, where a transfer apparatus has a plurality of transfer arms, motion patterns are categorized for the swing start angles of the respective transfer arms. The motion patterns can be thus suitably categorized into groups, and are provided with optimum time-based motion tracks.

FIG. 17 is a view showing pattern model data with categorized motion patterns, according to the experiment in relation to control of the transfer apparatus 180. The pattern model data 292 is arranged such that a plurality of similarity ranges of the swing start angle and motion stroke of the respective swing motions are preset, and the motion patterns are categorized in accordance with their combinations. In this case, where the composite accelerations of swing and slide motions form similar curved lines, they can be categorized into the same motion pattern group.

Figures 18, 19:
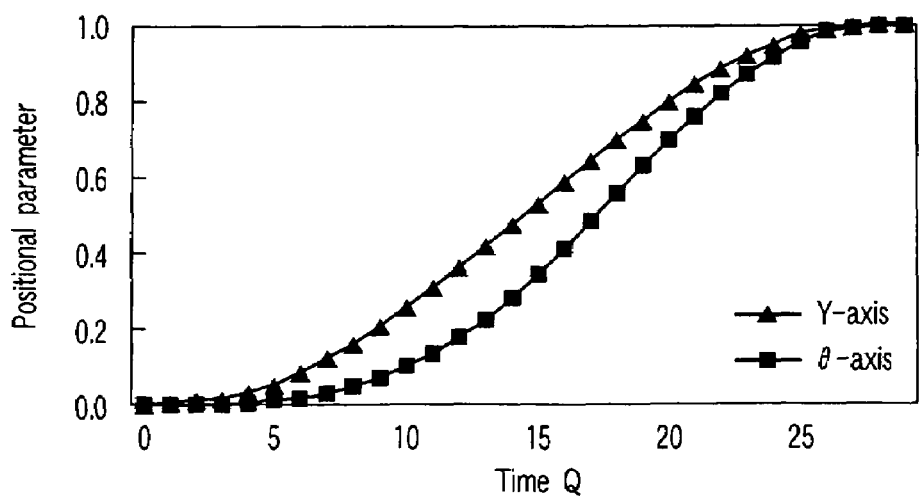
FIG. 18 is a view showing track model data of the sixth motion pattern P6 and ninth motion pattern P9 of the motion patterns shown in FIG. 17.
FIG. 19 is a graph showing a time-based motion track expressed by the positional parameters of the sixth motion pattern P6 shown in FIG. 18.

FIG. 18 is a view showing track model data of the sixth motion pattern P6 and ninth motion pattern P9 of the motion patterns shown in FIG. 17. FIG. 19 is a graph showing a time-based motion track expressed by the positional parameters of the sixth motion pattern P6 shown in FIG. 18. FIG. 20 is a graph showing a time-based motion track expressed by the positional parameters of the ninth motion pattern P9 shown in FIG. 18. FIG. 21 is a view schematically showing a motion of the transfer apparatus 180, corresponding to the sixth motion pattern P6 shown in FIG. 18. FIG. 22 is a view schematically showing a motion of the transfer apparatus 180, corresponding to the ninth motion pattern P9 shown in FIG. 18.

As shown in FIG. 21, the sixth motion pattern P6 is assumed such that, while only the second transfer arm 185B supports a wafer by the pick 184B, the first transfer arm 185A is moved from a position for accessing the process chamber 140E to a position for accessing the load-lock chamber 160M. Accordingly, in this case, the swing start angle and motion strokes are defined by those of the second transfer arm 185B, i.e., a swing start angle of $^{EM2}\theta_0$ and motion strokes of $^{EM}\theta_S$ and $Y_S$, respectively.

As shown in FIG. 22, ninth motion pattern P9 is assumed such that, while only the second transfer arm 185B supports a wafer by the pick 184B, the first transfer arm 185A is moved from a position for accessing the process chamber 140B to a position for accessing the load-lock chamber 160N. Accordingly, in this case, the swing start angle and motion strokes are defined by those of the second transfer arm 185B, i.e., a swing start angle of $^{BM2}\theta_0$ and motion strokes of $^{BM}\theta_S$ and $Y_S$, respectively.

Figure 23A:
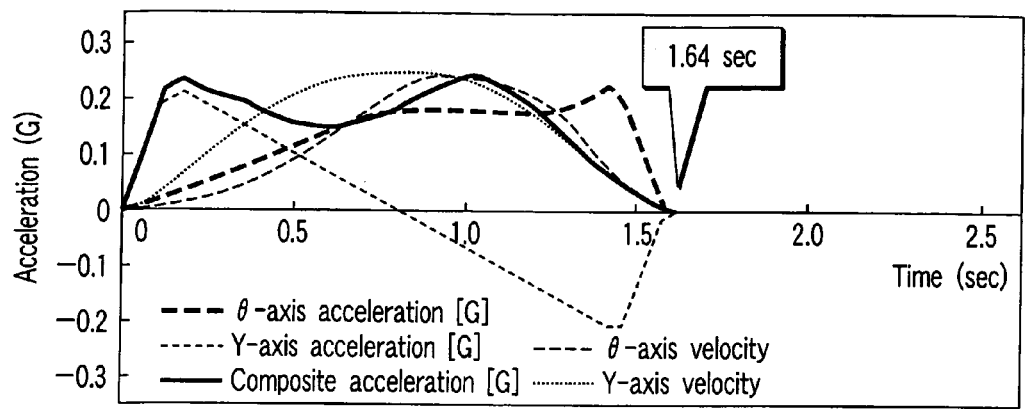
FIG. 23A is a graph showing velocity and acceleration in the respective axes and composite acceleration thereof where control is conducted by the positional parameters of the sixth motion pattern P6 shown in FIG. 18.
Figure 23B:
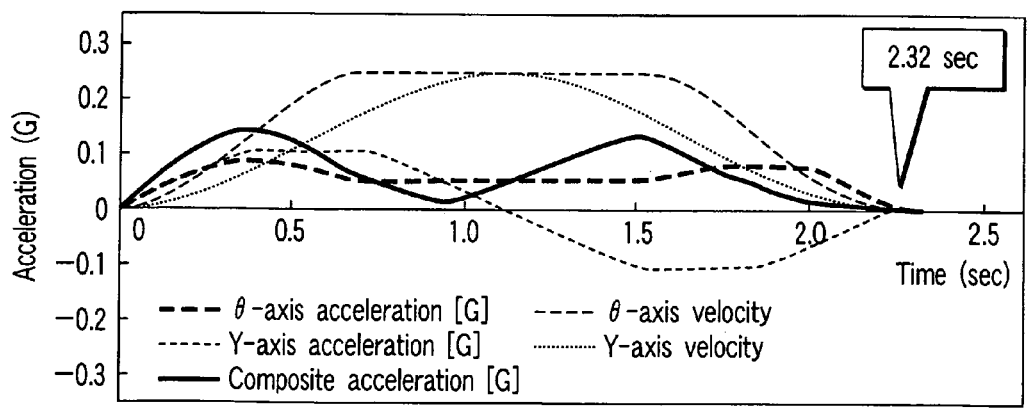
FIG. 23B is a graph showing velocity and acceleration in the respective axes and composite acceleration thereof where control is conducted by the positional parameters of a comparative example based on the motion shown in FIG. 21.
Figure 24A:
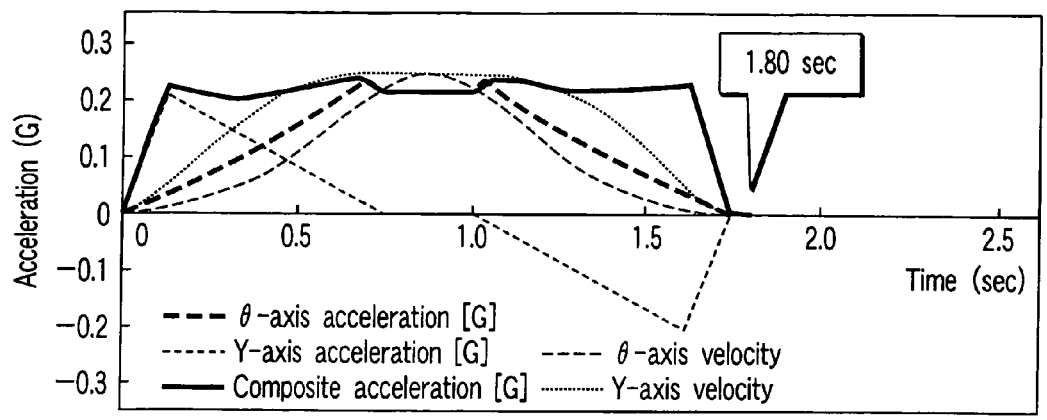
FIG. 24A is a graph showing velocity and acceleration in the respective axes and composite acceleration thereof where control is conducted by the positional parameters of the ninth motion pattern P9 shown in FIG. 18.
Figure 24B:
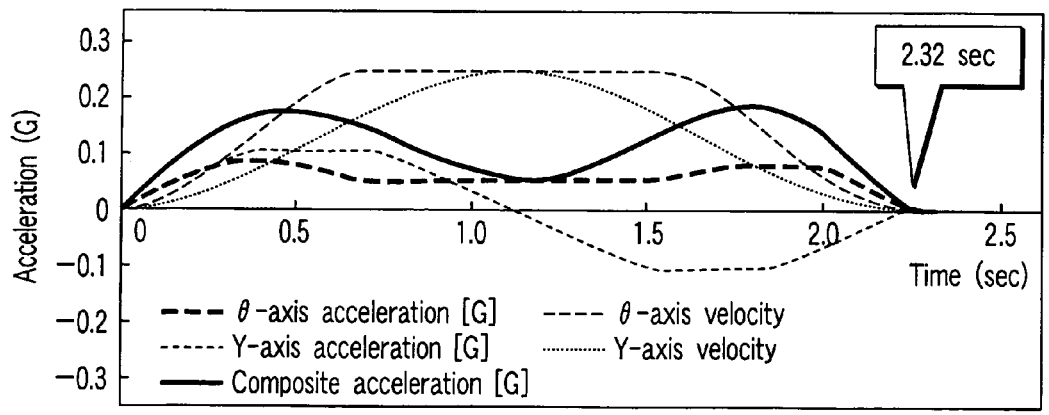
FIG. 24B is a graph showing velocity and acceleration in the respective axes and composite acceleration thereof where control is conducted by the positional parameters of a comparative example based on the motion shown in FIG. 22.

FIG. 23A is a graph showing velocity and acceleration in the respective axes and composite acceleration thereof where control is conducted by the positional parameters of the sixth motion pattern P6 shown in FIG. 18. FIG. 23B is a graph showing velocity and acceleration in the respective axes and composite acceleration thereof where control is conducted by the positional parameters of a comparative example based on the motion shown in FIG. 21. FIG. 24A is a graph showing velocity and acceleration in the respective axes and composite acceleration thereof where control is conducted by the positional parameters of the ninth motion pattern P9 shown in FIG. 18. FIG. 24B is a graph showing velocity and acceleration in the respective axes and composite acceleration thereof where control is conducted by the positional parameters of a comparative example based on the motion shown in FIG. 22. In the comparative examples shown in FIGS. 23B and 24B, the positional parameters are preset in accordance with the same concepts as those of the positional parameters shown in FIG. 12.

In the case of FIG. 23B, the entire motion stroke of the sixth motion pattern P6 shown in FIG. 21 is completed for an operational time period of 2.32 sec. In this case, however, although the composite acceleration does not exceed the permissible acceleration of 0.25 G through the entire motion stroke, the maximum value of the composite acceleration is about 0.15 G, which is far smaller than the permissible acceleration of 0.25 G. Accordingly, a higher velocity can be used to shorten the transfer time period, and thus this operational control cannot be considered as being sufficiently optimized to simultaneously perform swing and slide motions.

On the other hand, in the case of FIG. 23A, the entire motion stroke of the sixth motion pattern P6 shown in FIG. 21 is completed for a shorter operational time period of 1.64 sec. As compared with 2.32 sec of FIG. 23B, the operational time period is greatly shortened by 0.68 sec. In this case, the maximum value of the composite acceleration is increased to a larger value close to 0.25 G, but the composite acceleration does not exceed the permissible acceleration of 0.25 G through the entire motion stroke. Accordingly, a wafer being transferred never receives an excessive shock or vibration, thereby ensuring the stability of the wafer transfer.

In the case of FIG. 24B, the entire motion stroke of the ninth motion pattern P9 shown in FIG. 22 is completed for an operational time period of 2.32 sec, as in the case shown in FIG. 23B. In this case, however, although the composite acceleration does not exceed the permissible acceleration of 0.25 G through the entire motion stroke, the maximum value of the composite acceleration is about 0.20 G, which is still much less than the permissible acceleration of 0.25 G. Accordingly, a higher velocity can be used to shorten the transfer time period, and thus this operational control also cannot be considered as being sufficiently optimized to simultaneously perform swing and slide motions.

On the other hand, in the case of FIG. 24A, the entire motion stroke of the ninth motion pattern P9 shown in FIG. 22 is completed for a shorter operational time period of 1.80 sec. As compared with 2.32 sec of FIG. 24B, the operational time period is greatly shortened by 0.52 sec. In this case, the maximum value of the composite acceleration is increased to a larger value close to 0.25 G, but the composite acceleration does not exceed the permissible acceleration of 0.25 G through the entire motion stroke. Accordingly, a wafer being transferred never receives an excessive shock or vibration, thereby ensuring the stability of the wafer transfer.

As described above, each of the transfer arms is operated to simultaneously change the position and orientation, using the two axes, i.e., the θ-axis and Y-axis. In this case, if the positional parameters of a time-based motion track are preset in accordance with the severest conditions of the combination of motion strokes and swing start angle to attain a composite acceleration less than the permissible limit (such as the positional parameters shown in FIG. 12), such positional parameters can be applied to any motion pattern, as parameters to prevent the composite acceleration from exceeding the permissible limit. Accordingly, if such positional parameters of only one type are prepared, any motion pattern can be performed by the positional parameters while ensuring the stability of the wafer transfer.

However, if the time-based motion tracks of all the motion patterns are based on the same positional parameters of only one type, the composite acceleration of some of the motion patterns may become far smaller than the permissible limit, as shown in FIGS. 23B and 24B. In this case, since it is still possible to further shorten the transfer time period, the operational control is not yet sufficiently optimized in light of the transfer time period.

On the other hand, according to this embodiment, the motion patterns are provided with preset time-based motion tracks. Specifically, positional parameters are preset to shorten the transfer time period of each time-based motion track while ensuring the stability of the wafer transfer, and preventing the composite acceleration of swing and slide motions from exceeding the permissible limit. In other words, this embodiment allows the operation control of the transfer apparatus to be optimized for each motion pattern in light of not only the wafer transfer stability but also the transfer time period. In this embodiment, if a predetermined transfer time period is allocated to each motion pattern, positional parameters can be preset to complete the corresponding time-based motion track within the predetermined transfer time period while preventing the composite acceleration of swing and slide motions from exceeding the permissible limit.

As described above, according to this embodiment, the operation control of the transfer apparatus is suitably performed for the respective motion patterns each formed of only one of a swing motion and a slide motion, or a composite motion thereof. Consequently, optimum operational control is performed in accordance with each of the motion patterns, so that wafers are stably transferred with a higher velocity to shorten the transfer time period, thereby improving the throughput.

The operational control of the transfer apparatus according to the embodiment described above may be written as program instructions for execution on a processor, into a computer readable storage medium or media to be applied to a semiconductor processing system or the like. Alternately, program instructions of this kind may be transmitted by a communication medium or media and thereby applied to a semiconductor processing system or the like. Examples of the storage medium or media are a magnetic disk (flexible disk, hard disk (a representative of which is the hard disk of the CPU of the system), etc.), an optical disk (CD, DVD, etc.), a magneto-optical disk (MO, etc.), and a semiconductor memory. A computer for controlling the operation of the semiconductor processing system or the like reads program instructions stored in the storage medium or media, and executes them on a processor, thereby performing corresponding control, as described above.

In the embodiment described, the present invention is applied to the operational control of the transfer apparatus 180, but the invention may be similarly applied to the operational control of the transfer apparatus 170. In the embodiment described above, the target object is exemplified by a semiconductor wafer, but the target object may be another substrate, such as a glass substrate, LCD substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing system comprising:
a polygonal transfer chamber elongated in one direction;
a plurality of chambers disposed around and connected to the transfer chamber, the plurality of chambers including a process chamber configured to perform a process on a target object;
a transfer apparatus disposed in the transfer chamber and configured to transfer the target object to and from the plurality of chambers, the transfer apparatus including a base configured to perform a slide motion in a longitudinal direction of the transfer chamber, and an extendable/retractable transfer arm supported on the base and configured to perform a swing motion; and
a control section configured to control the transfer apparatus,
wherein the control section comprises
a storage portion that stores pattern model data concerning a plurality of motion patterns each indicative of a composite motion of the slide motion and the swing motion necessary for transferring the target object between two of the plurality of chambers, and track model data concerning time-based motion tracks of the slide motion and the swing motion, respectively corresponding to the motion patterns, each of the time-based motion tracks being preset to prevent a composite acceleration applied to the target object on the transfer arm by the composite motion from exceeding a permissible limit, and
an operational controller configured to retrieve a motion pattern and a time-based motion track from the pattern model data and the track model data to satisfy specific transfer of the target object between two of the plurality of chambers, and control an operation of the base and the transfer arm in accordance with the retrieved motion pattern and time-based motion track.

2. The processing system according to claim 1, wherein the pattern model data is arranged such that the motion patterns are categorized in accordance with a motion stroke of the slide motion, a motion stroke of the swing motion, and a swing start angle of the swing motion from a reference line.

3. The processing system according to claim 1, wherein the pattern model data is arranged such that the motion patterns are categorized in accordance with a loaded condition on the transfer arm, which has an effect on the composite acceleration.

4. The processing system according to claim 1, wherein the track model data is arranged such that each of the time-based motion tracks is preset to attain a shortest transfer time period, as long as the composite acceleration does not exceed the permissible limit.

5. The processing system according to claim 1, wherein the track model data is arranged such that each of the time-based motion tracks is preset to cause a motion and a motion change of the transfer arm to be continuous.

6. The processing system according to claim 2, wherein the track model data is arranged such that each of the time-based motion track is expressed by a dimensionless positional parameter indicative of a change with time in the slide motion and the swing motion, and the positional parameter is a value within a predetermined range defined by a maximum value and a minimum value respectively corresponding to a start point and a terminal point of each motion stroke, and
wherein the operational controller is configured to control an operation of the base and the transfer arm in accordance with data obtained by multiplying the positional parameter with a corresponding motion stroke.

7. The processing system according to claim 2, wherein the pattern model data is arranged such that the motion patterns are categorized in accordance with a similarity range preset for at least one of the motion strokes of the slide motion and the swing motion and the swing start angle.

8. A transfer apparatus for transferring a target object, the apparatus comprising:
a base configured to perform a slide motion;
an extendable/retractable transfer arm supported on the base and configured to perform a swing motion; and
a control section configured to control the transfer apparatus,
wherein the control section comprises
a storage portion that stores pattern model data concerning a plurality of motion patterns each indicative of a composite motion of the slide motion and the swing motion necessary for transferring the target object, and track model data concerning time-based motion tracks of the slide motion and the swing motion, respectively corresponding to the motion patterns, each of the time-based motion tracks being preset to prevent a composite acceleration applied to the target object on the transfer arm by the composite motion from exceeding a permissible limit; and
an operational controller configured to retrieve a motion pattern and a time-based motion track from the pattern model data and the track model data to satisfy specific transfer of the target object, and control an operation of the base and the transfer arm in accordance with the retrieved motion pattern and time-based motion track.

9. The transfer apparatus according to claim 8, wherein the pattern model data is arranged such that the motion patterns are categorized in accordance with a motion stroke of the slide motion, a motion stroke of the swing motion, and a swing start angle of the swing motion from a reference line.

10. The transfer apparatus according to claim 8, wherein the pattern model data is arranged such that the motion patterns are categorized in accordance with a loaded condition on the transfer arm, which has an effect on the composite acceleration.

11. The transfer apparatus according to claim 8, wherein the track model data is arranged such that each of the time-based motion tracks is preset to attain a shortest transfer time period, as long as the composite acceleration does not exceed the permissible limit.

12. The transfer apparatus according to claim 8, wherein the track model data is arranged such that each of the time-based motion tracks is preset to cause a motion and a motion change of the transfer arm to be continuous.

13. The transfer apparatus according to claim 9, wherein the track model data is arranged such that each of the time-based motion track is expressed by a dimensionless positional parameter indicative of a change with time in the slide motion and the swing motion, and the positional parameter is a value within a predetermined range defined by a maximum value and a minimum value respectively corresponding to a start point and a terminal point of each motion stroke, and
wherein the operational controller is configured to control an operation of the base and the transfer arm in accordance with data obtained by multiplying the positional parameter with a corresponding motion stroke.

14. The transfer apparatus according to claim 9, wherein the pattern model data is arranged such that the motion patterns are categorized in accordance with a similarity range preset for at least one of the motion strokes of the slide motion and the swing motion and the swing start angle.

15. A method for controlling a transfer apparatus for transferring a target object, the apparatus comprising a base configured to perform a slide motion, and an extendable/retractable transfer arm supported on the base and configured to perform a swing motion,
the method comprising:
storing, in a storage portion, pattern model data concerning a plurality of motion patterns each indicative of a composite motion of the slide motion and the swing motion necessary for transferring the target object, and track model data concerning time-based motion tracks of the slide motion and the swing motion, respectively corresponding to the motion patterns, each of the time-based motion tracks being preset to prevent a composite acceleration applied to the target object on the transfer arm by the composite motion from exceeding a permissible limit;
retrieving a motion pattern and a time-based motion track from the pattern model data and the track model data to satisfy specific transfer of the target object; and
controlling an operation of the base and the transfer arm in accordance with the retrieved motion pattern and time-based motion track.

16. The control method according to claim 15, wherein the pattern model data is arranged such that the motion patterns are categorized in accordance with a motion stroke of the slide motion, a motion stroke of the swing motion, and a swing start angle of the swing motion from a reference line.

17. The control method according to claim 15, wherein the pattern model data is arranged such that the motion patterns are categorized in accordance with a loaded condition on the transfer arm, which has an effect on the composite acceleration.

18. The control method according to claim 15, wherein the track model data is arranged such that each of the time-based motion tracks is preset to attain a shortest transfer time period, as long as the composite acceleration does not exceed the permissible limit.

19. The control method according to claim 15, wherein the track model data is arranged such that each of the time-based motion tracks is preset to cause a motion and a motion change of the transfer arm to be continuous.

20. The control method according to claim 16, wherein the track model data is arranged such that each of the time-based motion track is expressed by a dimensionless positional parameter indicative of a change with time in the slide motion and the swing motion, and the positional parameter is a value within a predetermined range defined by a maximum value and a minimum value respectively corresponding to a start point and a terminal point of each motion stroke, and wherein the method comprises controlling an operation of the base and the transfer arm in accordance with data obtained by multiplying the positional parameter with a corresponding motion stroke.

21. The control method according to claim 16, wherein the pattern model data is arranged such that the motion patterns are categorized in accordance with a similarity range preset for at least one of the motion strokes of the slide motion and the swing motion and the swing start angle.

* * * * *